US009650302B2

(12) United States Patent
Kimura et al.

(10) Patent No.: US 9,650,302 B2
(45) Date of Patent: May 16, 2017

(54) METHOD FOR PRODUCING ELECTROSTATIC CHUCK AND ELECTROSTATIC CHUCK

(75) Inventors: Takuji Kimura, Kariya (JP); Takahiro Takahashi, Handa (JP); Hirokazu Nakanishi, Handa (JP)

(73) Assignee: NGK Insulators, Ltd., Nagoya (JP)

( * ) Notice: Subject to any disclaimer, the term of this patent is extended or adjusted under 35 U.S.C. 154(b) by 1000 days.

(21) Appl. No.: 13/432,835

(22) Filed: Mar. 28, 2012

(65) Prior Publication Data

US 2012/0250212 A1 Oct. 4, 2012

(30) Foreign Application Priority Data

Mar. 30, 2011 (JP) .................. 2011-075445

(51) Int. Cl.
*H01L 21/683* (2006.01)
*C04B 35/645* (2006.01)
(Continued)

(52) U.S. Cl.
CPC ............ *C04B 35/645* (2013.01); *B28B 1/002* (2013.01); *B28B 3/025* (2013.01); *B32B 18/00* (2013.01);
(Continued)

(58) Field of Classification Search
CPC . H01L 21/6833; C04B 35/111; C04B 35/645; C04B 35/5626; C04B 35/62695;
(Continued)

(56) References Cited

U.S. PATENT DOCUMENTS 5,452,510 A 9/1995 Barnes et al.
6,322,936 B1 * 11/2001 Nishikawa et al. .............. 430/7
(Continued)

FOREIGN PATENT DOCUMENTS

CN 1988128 A 6/2007
CN 101110382 A 1/2008
(Continued)

OTHER PUBLICATIONS

Chinese Office Action (Application No. 201210088751.4) dated May 20, 2014.
(Continued)

*Primary Examiner* — Ann Hoang
(74) *Attorney, Agent, or Firm* — Burr & Brown, PLLC

(57) ABSTRACT

A method for producing an electrostatic chuck 10 includes the steps of (a) pouring a ceramic slurry containing a ceramic powder, a solvent, a dispersant, and a gelling agent into a first molding die 31 in which an electrostatic electrode precursor 24 is removably attached to an inner surface of the first molding die 31, gelatinizing the ceramic slurry by causing a chemical reaction of the gelling agent, and then removing the first molding die 31 to prepare an embedded-electrode-containing ceramic molded body 41X in which the electrostatic electrode precursor 24 is embedded in a first ceramic molded body 41; (b) preparing a second ceramic molded body 42; and (c) preparing a stacked calcined body 50 using the embedded-electrode-containing ceramic molded body 41X and the second ceramic molded body 42, and conducting hot-press firing of the stacked calcined body 50.

12 Claims, 9 Drawing Sheets

(51) Int. Cl.
    *B28B 1/00*     (2006.01)
    *B28B 3/02*     (2006.01)
    *B32B 18/00*     (2006.01)
    *C04B 35/111*     (2006.01)
    *C04B 35/56*     (2006.01)
    *C04B 35/626*     (2006.01)
    *C04B 35/634*     (2006.01)

(52) U.S. Cl.
    CPC ........ *C04B 35/111* (2013.01); *C04B 35/5626* (2013.01); *C04B 35/62695* (2013.01); *C04B 35/63456* (2013.01); *C04B 35/63488* (2013.01); *C04B 2235/3206* (2013.01); *C04B 2235/3217* (2013.01); *C04B 2235/5436* (2013.01); *C04B 2235/5445* (2013.01); *C04B 2235/604* (2013.01); *C04B 2235/6023* (2013.01); *C04B 2235/721* (2013.01); *C04B 2235/77* (2013.01); *C04B 2237/343* (2013.01); *C04B 2237/36* (2013.01); *H01L 21/6833* (2013.01)

(58) Field of Classification Search
    CPC ........ C04B 35/63456; C04B 35/63488; B28B 1/002; B28B 3/025; B32B 18/00
    USPC .......................................... 361/234
    See application file for complete search history.

(56) References Cited

U.S. PATENT DOCUMENTS

| | | | |
|---|---|---|---|
| 6,403,001 | B1* | 6/2002 | Hayashi ............... 264/109 |
| 7,547,407 | B2 | 6/2009 | Matsuda et al. |
| 8,008,602 | B2 | 8/2011 | Mori et al. |
| 2002/0167781 | A1* | 11/2002 | Matsuki et al. ............ 361/234 |
| 2002/0176219 | A1* | 11/2002 | Sakaue et al. ...... H01L 21/6831 361/234 |
| 2003/0232221 | A1 | 12/2003 | Yamada et al. |
| 2005/0218398 | A1* | 10/2005 | Tran ............... B82Y 10/00 257/14 |
| 2007/0146961 | A1 | 6/2007 | Morioka et al. |
| 2008/0047952 | A1 | 2/2008 | Mori et al. |
| 2008/0174930 | A1* | 7/2008 | Hattori et al. ........... 361/234 |
| 2009/0035538 | A1 | 2/2009 | Namerikawa et al. |
| 2010/0084165 | A1 | 4/2010 | Namerikawa et al. |
| 2010/0092657 | A1 | 4/2010 | Namerikawa et al. |

FOREIGN PATENT DOCUMENTS

| | | | |
|---|---|---|---|
| CN | 101330107 A | | 12/2008 |
| CN | 101353259 A | | 1/2009 |
| JP | 07-201961 A1 | | 8/1995 |
| JP | 11-255566 A1 | | 9/1999 |
| JP | 02/21590 A2 | | 3/2002 |
| JP | 2002-093895 A1 | | 3/2002 |
| JP | 2004-508728 A1 | | 3/2004 |
| JP | 2007-070142 A1 | | 3/2004 |
| JP | 2004-136647 A1 | | 5/2004 |
| JP | 2005-209755 A | | 8/2005 |
| JP | 2005-343733 A1 | | 12/2005 |
| JP | 2007070142 A | * | 3/2007 |
| JP | 2008-047885 A1 | | 2/2008 |
| JP | 2009-208459 A1 | | 9/2009 |
| KR | 10-2009-0012184 | | 2/2009 |
| KR | 10-0883155 | | 2/2009 |
| TW | 201034114 A1 | | 9/2010 |
| WO | 2010/082606 A1 | | 7/2010 |

OTHER PUBLICATIONS

Taiwanese Office Action, Taiwanese Application No. 20120110994, dated Dec. 9, 2015 (8 pages).

Korean Office Action, Korean Application No. 10-2012-0031802, dated Mar. 10, 2017 (11 pages).

Chinese Office Action, Chinese Application No. 201510174096.8, dated Mar. 28, 2017 (5 pages).

* cited by examiner

METHOD FOR PRODUCING ELECTROSTATIC CHUCK AND ELECTROSTATIC CHUCK

BACKGROUND OF THE INVENTION

1. Field of the Invention

The present invention relates to a method for producing an electrostatic chuck and an electrostatic chuck.

2. Description of the Related Art

Examples of known methods for producing electrostatic chucks include a method for producing an electrostatic chuck having a two-layer structure and a method for producing an electrostatic chuck having a three-layer structure.

An example of the former known method includes a step of forming an alumina sintered body, a step of printing an electrode paste for forming an electrostatic electrode on the alumina sintered body, a step of placing an alumina granulated powder on the electrode paste and molding the resulting product in a die, and a step of firing the resulting molded body integrated in the step of molding in the die (refer to Patent Literature 1). Patent Literature 1 also discloses that an alumina calcined body is used instead of the alumina sintered body. Note that since an alumina powder used in this method contains a binder, this alumina powder is generally referred to as "alumina granulated powder".

An example of the latter known method includes a step of printing an electrode paste for forming an electrostatic electrode on an upper surface of an alumina sintered body and printing an electrode paste for forming a heater electrode on a lower surface of the alumina sintered body, a step of calcining the alumina sintered body after printing, a step of placing an alumina granulated powder on the electrostatic electrode and placing the alumina granulated powder under the heater electrode, and a step of pressure-molding the resulting product and pressure-firing the resulting pressure-molded body in such a state (refer to Patent Literature 2). Note that since an alumina powder prepared by mixing with a binder and spray-drying the mixed powder using a spray dryer is used in this method, this alumina powder is generally referred to as "alumina granulated powder".

CITATION LIST

Patent Literature

[PTL 1] Japanese Unexamined Patent Application Publication No. 2005-343733
[PTL 2] Japanese Unexamined Patent Application Publication No. 2008-47885

SUMMARY OF THE INVENTION

However, in the production methods described in Patent Literatures 1 and 2, since an alumina granulated powder is placed on the electrostatic electrode, pressure-molding is performed, and then firing is performed, an end face of the electrostatic electrode may deform and taper at an acute angle. When the end face of the electrostatic electrode has such an acute angle shape, cracks tend to be formed because of, for example, concentration of stress and concentration of an electric field at the end face. Thus, it becomes difficult to sufficiently ensure durability of the resulting product.

The present invention has been made in order to solve this problem and a main object of the present invention is to suppress deformation of an end face of the electrostatic electrode.

Solution to Problem

In a first method for producing an electrostatic chuck of the present invention, the electrostatic chuck is obtained by conducting hot-press firing of a stacked calcined body in which a pair of ceramic calcined bodies are stacked so as to sandwich an electrostatic electrode having a predetermined shape or a precursor thereof, the method comprises the steps of:

(a) pouring a ceramic slurry containing a ceramic powder, a solvent, a dispersant, and a gelling agent into a first molding die in which the electrostatic electrode or the precursor thereof is removably attached to an inner surface of the first molding die, gelatinizing the ceramic slurry by causing a chemical reaction of the gelling agent, and then removing the first molding die to prepare an embedded-electrode-containing ceramic molded body in which the electrostatic electrode or the precursor thereof is embedded in a first ceramic molded body;

(b) preparing a second ceramic molded body; and (c) preparing the stacked calcined body using the embedded-electrode-containing ceramic molded body and the second ceramic molded body, and conducting hot-press firing of the stacked calcined body.

According to this method for producing an electrostatic chuck, deformation of an end face of the electrostatic electrode having a predetermined shape can be suppressed. Specifically, the reason for this is believed to be as follows: In step (a), when a ceramic slurry is poured into the first molding die in which the electrostatic electrode or the precursor thereof is removably attached to the inner surface of the first molding die, and is gelled, since the ceramic slurry in the initial stage of a reaction has a low viscosity and high fluidity, chipping of an edge of the electrostatic electrode or the precursor thereof can be suppressed, and in addition, particles of the ceramic powder are uniformly arranged without spaces therebetween on the interface with the electrode and thus deformation of the electrode can be suppressed during the hot-press firing in step (c). Incidentally, the term "precursor of an electrostatic electrode" refers to a component to be formed into an electrostatic electrode by hot-press firing, for example, a component prepared by printing an electrode paste so as to have the shape of the electrostatic electrode (hereinafter the same).

In the first method for producing an electrostatic chuck of the present invention, in step (b), the second ceramic molded body may be prepared by pouring a ceramic slurry containing a ceramic powder, a solvent, a dispersant, and a gelling agent into a second molding die, gelatinizing the ceramic slurry by causing a chemical reaction of the gelling agent, and then removing the second molding die. In this case, the second ceramic molded body has the same density as the embedded-electrode-containing ceramic molded body. This is advantageous in that warpage of the resulting stacked sintered body after the hot-press firing can be reduced, the variation in the distance between a wafer-receiving surface and the electrostatic electrode can be reduced, and thus the in-plane variation in the chucking force during chucking of a wafer can be reduced.

In the first method for producing an electrostatic chuck of the present invention, in step (b), the second ceramic molded body may be prepared by preparing a molding die for integration, removably attaching a surface of the embedded-electrode-containing ceramic molded body, the surface being opposite to an electrode forming surface, to an inner surface of the molding die for integration, then pouring a ceramic slurry containing a ceramic powder, a solvent, a dispersant, and a gelling agent into the molding die for integration, and gelatinizing the ceramic slurry by causing a chemical reaction of the gelling agent, and, in step (c), the stacked calcined body may be prepared by taking out, from the molding die for integration, a stacked composite body in which the embedded-electrode-containing ceramic molded body and the second ceramic molded body are stacked, and calcining the stacked composite body. In this case, since the stacked composite body can be obtained at the same time as the preparation of the second ceramic molded body, the number of steps can be reduced as compared with the case where a step of preparing the second ceramic molded body and a step of preparing the stacked composite body are separately conducted. The size of the inner space of the molding die for integration may be determined, for example, in consideration of a shrinkage ratio with respect to the electrostatic chuck.

In the first method for producing an electrostatic chuck of the present invention, in step (a), the embedded-electrode-containing ceramic molded body may be calcined to prepare an embedded-electrode-containing ceramic calcined body, and, in step (b) and the subsequent step, the embedded-electrode-containing ceramic calcined body may be used instead of the embedded-electrode-containing ceramic molded body. Also in this method, the difference in the density in the stacked body before the hot-press firing can be reduced. This is advantageous in that warpage of the resulting stacked sintered body after the hot-press firing can be reduced, and thus the in-plane variation in the chucking force during chucking of a wafer can be reduced.

In a second method for producing an electrostatic chuck in the present invention, an electrostatic chuck is obtained by conducting hot-press firing of a stacked calcined body in which a pair of ceramic calcined bodies are stacked so as to sandwich an electrostatic electrode having a predetermined shape or a precursor thereof, the method comprises the steps of:

(a) pouring a ceramic slurry containing a ceramic powder, a solvent, a dispersant, and a gelling agent into a first molding die in which a projection having the same shape as an electrostatic electrode or a precursor thereof is non-removably provided on an inner surface of the first molding die, gelatinizing the ceramic slurry by causing a chemical reaction of the gelling agent, then removing the first molding die to prepare a first ceramic molded body having a recess corresponding to the projection, and forming the electrostatic electrode or the precursor thereof in the recess to prepare an embedded-electrode-containing ceramic molded body;

(b) preparing the second ceramic molded body; and (c) preparing a stacked calcined body using the embedded-electrode-containing ceramic molded body and the second ceramic molded body, and conducting hot-press firing of the stacked calcined body.

This method for producing an electrostatic chuck can also suppress deformation of an end face of the electrostatic chuck having a predetermined shape. Specifically, in step (a), a first ceramic molded body having a recess is prepared and an electrostatic electrode or a precursor thereof is formed in the recess to prepare an embedded-electrode-containing ceramic molded body. The first ceramic molded body is prepared by gelatinizing a ceramic slurry containing a ceramic powder dispersed therein. Therefore, the first ceramic molded body has a strength higher than that in the case where a molded body is prepared using a ceramic granulated powder (described above), and thus an edge of the electrostatic electrode formed in the recess is not easily deformed. Furthermore, since the electrostatic electrode or the precursor thereof does not protrude toward the outside, there is no concern that an edge of the electrostatic electrode or the precursor thereof is deformed by being rubbed against other components. In addition, it is believed that particles of the ceramic powder are uniformly arranged without spaces therebetween on the interface with the electrode, and deformation of the electrode can be suppressed during the hot-press firing in step (c). It is believed that, as a result, deformation of an end face of the electrostatic electrode having a predetermined shape can be suppressed.

In the second method for producing an electrostatic chuck of the present invention, in step (b), the second ceramic molded body may be prepared by pouring a ceramic slurry containing a ceramic powder, a solvent, a dispersant, and a gelling agent into a second molding die, gelatinizing the ceramic slurry by causing a chemical reaction of the gelling agent, and then removing the second molding die. In this case, the second ceramic molded body has the same density as the embedded-electrode-containing ceramic molded body. This is advantageous in that warpage of the resulting stacked sintered body after the hot-press firing can be reduced, the variation in the distance between a wafer-receiving surface and the electrostatic electrode can be reduced, and thus the in-plane variation in the chucking force during chucking of a wafer can be reduced.

In the second method for producing an electrostatic chuck of the present invention, in step (b), the second ceramic molded body may be prepared by preparing a molding die for integration, removably attaching a surface of the embedded-electrode-containing ceramic molded body, the surface being opposite to an electrode forming surface, to an inner surface of the molding die for integration, then pouring a ceramic slurry containing a ceramic powder, a solvent, a dispersant, and a gelling agent into the molding die for integration, gelatinizing the ceramic slurry by causing a chemical reaction of the gelling agent, and, in step (c), the stacked calcined body may be prepared by taking out, from the molding die for integration, a stacked composite body in which the embedded-electrode-containing ceramic molded body and the second ceramic molded body are stacked, and calcining the stacked composite body. In this case, since the stacked composite body can be obtained at the same time as the preparation of the second ceramic molded body, the number of steps can be reduced as compared with the case where a step of preparing the second ceramic molded body and a step of preparing the stacked composite body are separately conducted. The size of the inner space of the molding die for integration may be determined, for example, in consideration of a shrinkage ratio with respect to the electrostatic chuck.

In the second method for producing an electrostatic chuck of the present invention, in step (a), the first ceramic molded body may be calcined before or after the formation of the electrostatic electrode or the precursor thereof in the recess to prepare an embedded-electrode-containing ceramic calcined body, and, in step (b) and the subsequent step, the embedded-electrode-containing ceramic calcined body may be used instead of the embedded-electrode-containing ceramic molded body. Also in this method, the difference in the density in the stacked body before the hot-press firing can be reduced. This is advantageous in that warpage of the resulting stacked sintered body after the hot-press firing can be reduced, and thus the in-plane variation in the chucking force during chucking of a wafer can be reduced.

In a third method for producing an electrostatic chuck in the present invention, an electrostatic chuck is obtained by conducting hot-press firing of a stacked calcined body in which a pair of ceramic calcined bodies are stacked so as to sandwich an electrostatic electrode having a predetermined shape or a precursor thereof, the method comprises the steps of:

(a) preparing a first ceramic molded body, and forming an electrostatic electrode or a precursor thereof on a surface of the first ceramic molded body to prepare a projecting-electrode-containing ceramic molded body;

(b) removably attaching a surface of the projecting-electrode-containing ceramic molded body, the surface being opposite to an electrode forming surface, to an inner surface of a molding die for integration, then pouring a ceramic slurry containing a ceramic powder, a solvent, a dispersant, and a gelling agent into the molding die for integration, gelatinizing the ceramic slurry by causing a chemical reaction of the gelling agent to prepare a second ceramic molded body, and then removing the molding die for integration to prepare a stacked composite body including the projecting-electrode-containing ceramic molded body and the second ceramic molded body; and (c) preparing the stacked calcined body using the stacked composite body, and conducting hot-press firing of the stacked calcined body.

This method for producing an electrostatic chuck can also suppress deformation of an end face of the electrostatic chuck having a predetermined shape. Specifically, the reason for this is believed to be as follows: In step (b), when the projecting-electrode-containing ceramic molded body is removably attached to an inner surface of the molding die for integration, and a ceramic slurry is then poured into the molding die for integration, and is gelled, since the ceramic slurry in the initial stage of a reaction has a low viscosity and high fluidity, chipping of an edge of the electrostatic electrode of the projecting-electrode-containing ceramic molded body or the precursor thereof can be suppressed, and in addition, particles of the ceramic powder are uniformly arranged without spaces therebetween on the interface with the electrode and thus deformation of the electrode can be suppressed during the hot-press firing in step (c). The size of the inner space of the molding die for integration may be determined, for example, in consideration of a shrinkage ratio with respect to the electrostatic chuck.

In the third method for producing an electrostatic chuck of the present invention, in step (a), the first ceramic molded body may be prepared by pouring a ceramic slurry containing a ceramic powder, a solvent, a dispersant, and a gelling agent into a first molding die, gelatinizing the ceramic slurry by causing a chemical reaction of the gelling agent, and then removing the first molding die. In this case, the first ceramic molded body has the same density as the second ceramic molded body. This is advantageous in that warpage of the resulting stacked sintered body after the hot-press firing can be reduced, the variation in the distance between a wafer-receiving surface and the electrostatic electrode can be reduced, and thus the in-plane variation in the chucking force during chucking of a wafer can be reduced.

In the third method for producing an electrostatic chuck of the present invention, in step (a), the first ceramic molded body may be calcined before or after the formation of the electrostatic electrode or the precursor thereof on the surface to prepare a projecting-electrode-containing ceramic calcined body, and, in step (b) and the subsequent step, the projecting-electrode-containing ceramic calcined body may be used instead of the projecting-electrode-containing ceramic molded body. Also in this method, the difference in the density in the stacked body before the hot-press firing can be reduced. This is advantageous in that warpage of the resulting stacked sintered body after the hot-press firing can be reduced, and thus the in-plane variation in the chucking force during chucking of a wafer can be reduced.

In the first to third methods for producing electrostatic chucks of the present invention, it may also be possible to use, as the stacked calcined body, a stacked calcined body having a structure in which a pair of ceramic calcined bodies are stacked so as to sandwich an electrostatic electrode or a precursor thereof and a pair of ceramic calcined bodies are stacked so as to sandwich a heater electrode or a precursor thereof. In this case, regarding the structure in which a pair of ceramic calcined bodies are stacked so as to sandwich a heater electrode or a precursor thereof, the stacked calcined body is preferably prepared by replacing the electrostatic electrode or the precursor thereof with the heater electrode or the precursor thereof in accordance with any of the above-described first to third methods for producing electrostatic chucks. In this case, deformation of an end face of the heater electrode having a predetermined shape can be suppressed. Alternatively, one of the pair of the ceramic calcined bodies sandwiching the electrostatic electrode or the precursor thereof may be a component common to one of the pair of the ceramic calcined bodies sandwiching the heater electrode or the precursor thereof. That is, the stacked calcined body may have a structure of ceramic calcined body/electrostatic electrode/ceramic calcined body/heater electrode/ceramic calcined body.

In the first to third methods for producing electrostatic chucks of the present invention, the ceramic powder preferably has an average particle diameter of 0.4 to 0.6 μm. In this case, the advantages described above can be more noticeably achieved. The reason for this is believed that particles of the ceramic powder are uniformly arranged without spaces therebetween on the interface with the electrode and thus deformation of the electrode can be suppressed during the hot-press firing in step (c).

An electrostatic chuck the present invention includes an electrostatic electrode therein, wherein when a longitudinal cross section of the electrostatic electrode is viewed, an end face of the electrostatic electrode is formed by a flat surface or a bulging surface, and an angle θ formed by joining an upper corner, a bulging end, and a lower corner of the bulging surface satisfies 160°≤θ<180°.

According to this electrostatic chuck, since an edge of the electrostatic electrode does not taper at an acute angle, stress does not tend to concentrate at the edge. Consequently, cracks are not easily formed, and thus durability of the resulting product can be sufficiently ensured.

DETAILED DESCRIPTION OF THE INVENTION

Figure 1:
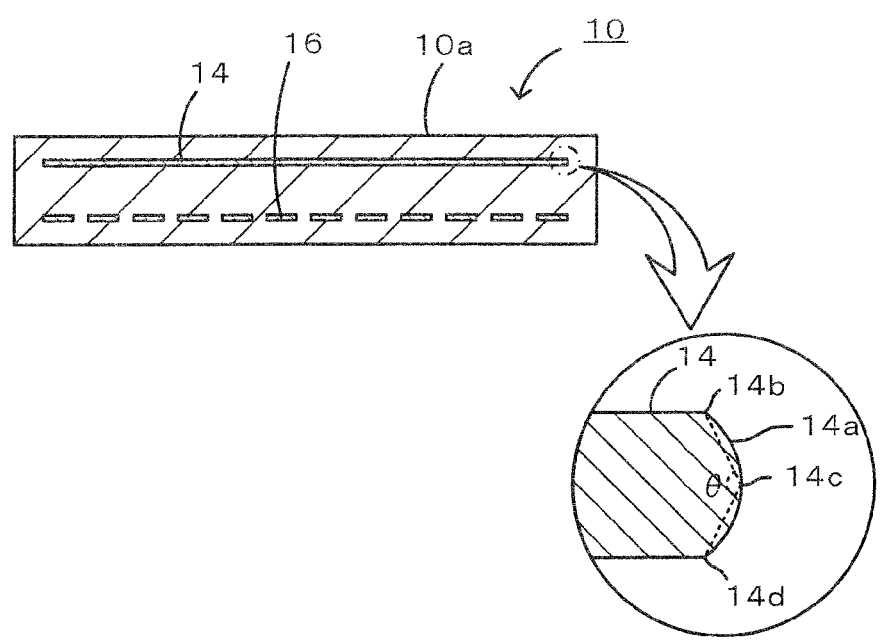
FIG. 1 is a longitudinal cross-sectional view of an electrostatic chuck 10, and the figure in the circle is a partially enlarged view.

1. Preparation of Ceramic Molded Body by Gel Casting Method

The term "gel casting method" refers to a method for preparing a ceramic molded body, the method including pouring a ceramic slurry containing a ceramic powder, a solvent, a dispersant, and a gelling agent into a molding die, gelatinizing the ceramic slurry by causing a chemical reaction of the gelling agent, and then removing the die. The gel casting method is employed in at least step (a) in first and second methods for producing electrostatic chucks of the present invention and step (b) in a third method for producing an electrostatic chuck of the present invention.

The material of the ceramic powder may be an oxide ceramic or a non-oxide ceramic. Examples thereof include alumina, yttria, aluminum nitride, silicon nitride, silicon carbide, samaria, magnesia, magnesium fluoride, and ytterbium oxide. These materials may be used alone or in combination of two or more materials. The average particle diameter of the ceramic powder is not particularly limited as long as a homogeneous ceramic slurry can be prepared, but is preferably 0.4 to 0.6 µm and more preferably 0.45 to 0.55 µm.

The solvent is not particularly limited as long as the solvent dissolves the dispersant and the gelling agent. Examples thereof include hydrocarbon solvents (such as toluene, xylene, and solvent naphtha), ether solvents (such as ethylene glycol monoethylether, butyl carbitol, and butyl carbitol acetate), alcohol solvents (such as isopropanol, 1-butanol, ethanol, 2-ethyl hexanol, terpineol, ethylene glycol, and glycerin), ketone solvents such as (acetone and methyl ethyl ketone), ester solvents (such as butyl acetate, dimethyl glutarate, and triacetin), and polybasic acid solvents (such as glutaric acid). In particular, solvents having two or more ester bonds, such as polybasic acid esters (e.g., dimethyl glutarate) and acid esters of polyhydric alcohols (e.g., triacetin) are preferably used.

The dispersant is not particularly limited as long as the dispersant homogeneously disperses a ceramic powder in a solvent. Examples thereof include polycarboxylic acid copolymers, polycarboxylic acid salts, sorbitan fatty acid esters, polyglycerol fatty acid esters, phosphate ester copolymers, sulfonate copolymers, and polyurethane-polyester copolymers having tertiary amines. In particular, polycarboxylic acid copolymers, polycarboxylic acid salts, etc. are preferably used. Addition of the dispersant can reduce the viscosity of the slurry before molding and impart high fluidity to the slurry.

The gelling agent may contain, for example, an isocyanate, a polyol, and a catalyst. The isocyanate is not particularly limited as long as it is a substance having an isocyanate group as a functional group. Examples thereof include tolylene diisocyanate (TDI), diphenylmethane diisocyanate (MDI), and modified products thereof. Reactive functional groups other than isocyanate groups may be contained in the molecule. Furthermore, as in a polyisocyanate, a large number of reactive functional groups may be contained. The polyol is not particularly limited as long as it is a substance having two or more hydroxyl groups that can react with isocyanate groups. Examples thereof include ethylene glycol (EG), polyethylene glycol (PEG), propylene glycol (PG), polypropylene glycol (PPG), polytetramethylene glycol (PTMG), polyhexamethylene glycol (PHMG), and polyvinyl alcohol (PVA). The catalyst is not particularly limited as long as it is a substance that accelerates the urethane reaction between the isocyanate and the polyol. Examples thereof include triethylenediamine, hexanediamine, and 6-dimethylamino-1-hexanol.

In the gel casting method, preferably, first, a solvent and a dispersant are added to a ceramic powder in a predetermined ratio, and these components are mixed for a predetermined time to prepare a slurry precursor. Preferably, a gelling agent is then added to the slurry precursor, and the resulting mixture is mixed and defoamed in a vacuum to prepare a ceramic slurry. The mixing method for preparing the slurry precursor and the slurry is not particularly limited. For example, a ball mill, rotation-revolution-stirrer, vibration stirring, blade stirring, or the like can be employed. It should be noted that a ceramic slurry prepared by adding a gelling agent to a slurry precursor is preferably poured into a molding die as soon as possible because the chemical reaction (urethane reaction) of the gelling agent starts to proceed with time. The ceramic slurry poured into the molding die is gelled by a chemical reaction of the gelling agent contained in the slurry. The chemical reaction of the gelling agent is a urethane reaction that occurs between the isocyanate and the polyol and that produces a urethane resin (polyurethane). The ceramic slurry is gelled by the reaction of the gelling agent and the urethane resin functions as an organic binder.

2. Preparation of Ceramic Calcined Body

In order to prepare a ceramic calcined body, a ceramic molded body is dried, then degreased, and calcined.

The ceramic molded body is dried in order to evaporate a solvent contained in the ceramic molded body. The drying temperature and the drying time can be appropriately set in accordance with the solvent used. The drying temperature is carefully set so that cracks are not formed in the ceramic molded body during drying. The atmosphere may be any of an air atmosphere, an inert atmosphere, and a vacuum atmosphere. The dimension is reduced in a horizontal direction by about 2% by drying.

The ceramic molded body after drying is degreased in order to decompose and remove organic substances such as the dispersant and the catalyst. The degreasing temperature can be appropriately set in accordance with the type of organic substances contained. For example, the degreasing temperature may be set to 400° C. to 600° C. The atmosphere may be any of an air atmosphere, an inert atmosphere, and a vacuum atmosphere.

The ceramic molded body after degreasing is calcined in order to increase the strength thereof and to make the ceramic molded body easy to handle. The calcination temperature is not particularly limited, but may be set to, for example, 750° C. to 900° C. The atmosphere may be any of an air atmosphere, an inert atmosphere, and a vacuum atmosphere. The dimension is reduced in a horizontal direction by about 1.5% by degreasing and calcination.

3. Formation of Electrostatic Electrode

An electrostatic electrode may be formed by arranging a conductive material so as to have a predetermined shape, or may be formed by arranging an electrode paste so as to have a predetermined shape and then baking the electrode paste. An electrode paste arranged so as to have a predetermined shape is referred to as "electrostatic electrode precursor". The electrode paste is not particularly limited and may contain, for example, a conductive material, a ceramic powder, a binder, and a solvent. Examples of the conductive material include tungsten, tungsten carbide, platinum, silver, palladium, nickel, and molybdenum. Examples of the ceramic powder include powders composed of the same ceramic material as the ceramic calcined body. Examples of the binder include ethyl cellulose, polymethyl methacrylate, and polyvinyl butyral. An example of the solvent is terpineol. An example of a printing method is a screen printing method. An electrostatic electrode paste and a heater electrode paste may have the same composition or different compositions.

4. Hot-Press Firing

In hot-press firing, the pressing pressure is preferably 30 to 300 kgf/cm$^2$ and more preferably 50 to 250 kgf/cm$^2$ at least at the maximum temperature (firing temperature). The maximum temperature can be appropriately set in accordance with, for example, the type and the particle diameter of the ceramic powder, but is preferably set in the range of 1,000° C. to 2,000° C. The atmosphere may be appropriately selected from an air atmosphere, an inert atmosphere, and a vacuum atmosphere in accordance with the type of ceramic powder. The dimension is reduced in a thickness direction by about 50% by hot-press firing.

5. Embodiment of Electrostatic Chuck

FIG. 1 is a longitudinal cross-sectional view of an electrostatic chuck 10, and the figure in the circle is a partially enlarged view. As illustrated in FIG. 1, the electrostatic chuck 10 has an electrostatic electrode 14 and a heater electrode 16 therein. The electrostatic electrode 14 is a disc-shaped electrode and is provided on the side close to a wafer-receiving surface 10a. The heater electrode 16 is a line-shaped component having a starting point and an end point (not illustrated) near the center of the electrostatic chuck 10. The heater electrode 16 has a shape that starts from the starting point, is arranged so as to pass over the entire flat surface of the electrostatic chuck 10, and returns to the end point in the manner of a single brush stroke. Since FIG. 1 is a cross-sectional view of the electrostatic chuck 10, the heater electrode 16 discontinuously appears. However, the heater electrode 16 has a continuous line-like shape in plan view.

Such an electrostatic chuck 10 is produced by any of first to third methods for producing electrostatic chucks of the present invention. Specific examples of the methods will be described later.

A partially enlarged view of a longitudinal cross section of the electrostatic electrode 14 of the electrostatic chuck 10 is illustrated in the circle of FIG. 1. This example illustrates a case where an end face 14a of the electrostatic electrode 14 is formed by a bulging surface. An angle θ is an angle formed by a straight line joining an upper corner 14b and a bulging end 14c of the end face 14a and a straight line joining the bulging end 14c and a lower corner 14d of the end face 14a. The bulging end 14c is a portion of the end face 14a, the portion protruding toward the outermost side. In this example, the angle θ satisfies 160°≤θ<180°. The end face 14a of the electrostatic electrode 14 may be formed by a flat, vertical surface instead of such a bulging surface. An end face of the heater electrode 16 is similar to the end face 14a of the electrostatic electrode 14, and thus a description thereof is omitted. It should be noted that the angle θ of electrostatic chucks produced by the methods described in Patent Literatures 1 and 2 may be an acute angle in the range of 30° to 50°.

According to the electrostatic chuck 10 described above, the end faces of the electrostatic electrode 14 and the heater electrode 16 do not taper at an acute angle. Thus, for example, concentration of stress and concentration of an electric field do not tend to occur at the end faces. Consequently, cracks are not easily formed, and thus durability of the resulting product can be sufficiently ensured.

The electrostatic chuck 10 described above has the heater electrode 16 therein. Alternatively, the electrostatic chuck 10 may not have the heater electrode 16 therein.

Figure 2:
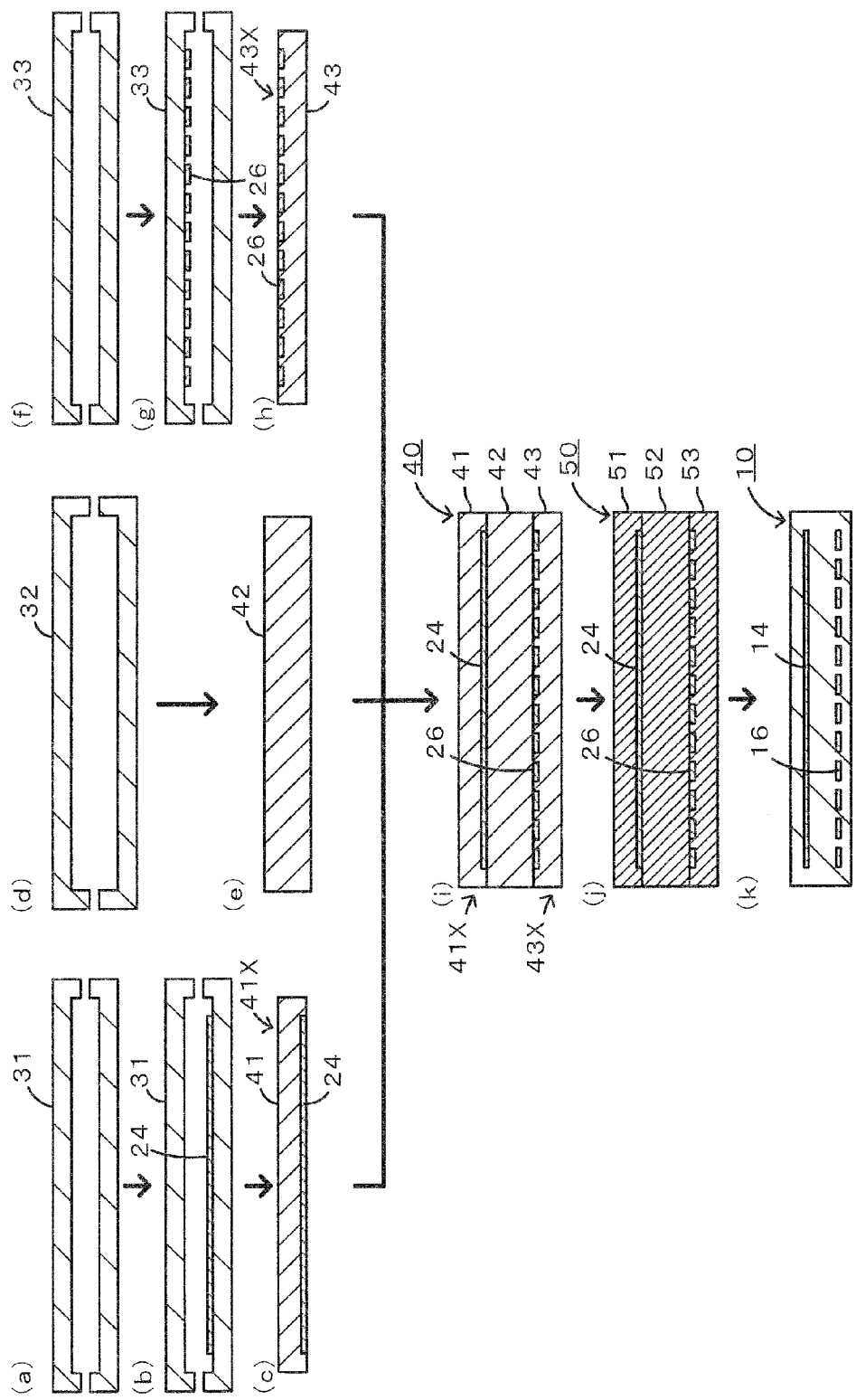
FIG. 2 is a production process drawing illustrating an example of a first method for producing an electrostatic chuck.

6. Embodiments of Method for Producing Electrostatic Chuck (1) Embodiments of First Method for Producing Electrostatic Chuck A method for producing an electrostatic chuck 10 will now be described with reference to FIG. 2. FIG. 2 is a production process drawing illustrating an example of a first method for producing an electrostatic chuck. In summary, in this method, an electrostatic chuck 10 is produced by conducting hot-press firing of a stacked calcined body 50 in which, as illustrated in FIGS. 2 (j), a first ceramic calcined body 51 and a second ceramic calcined body 52 are stacked so as to sandwich an electrostatic electrode precursor 24 and the second ceramic calcined body 52 and a third ceramic calcined body 53 are stacked so as to sandwich a heater electrode precursor 26. Specific steps will now be described.

(1-1) Preparation of First Ceramic Molded Body 41

First, a first molding die 31 is prepared (refer to FIG. 2 (a)). This first molding die 31 has an inner space having a size in which a shrinkage ratio is taken into account with respect to the first ceramic calcined body 51 (inner space slightly larger than the first ceramic calcined body 51). Inner surfaces of the first molding die 31 are subjected to a coating or lining treatment with a fluorocarbon resin, and have good removability of an electrode and a molded body. An electrode paste is screen-printed on an inner surface of a lower die of the first molding die 31 to form an electrostatic electrode precursor 24 having a dimension larger than an electrostatic electrode 14 by about several percent in a horizontal direction (refer to FIG. 2 (b)). This electrostatic electrode precursor 24 is removable from the inner surface of the first molding die 31 because of the coating or the lining treatment with the fluorocarbon resin. The outer peripheral surface of the electrostatic electrode precursor 24 is formed by a flat, vertical surface. Next, a ceramic slurry containing a ceramic powder, a solvent, a dispersant, and a gelling agent is poured into the first molding die 31. The ceramic slurry is gelled by causing a chemical reaction of the gelling agent, and the first molding die 31 is then removed. Thus, a first ceramic molded body 41 in which the electrostatic electrode precursor 24 is embedded, i.e., an embedded-electrode-containing ceramic molded body 41X is obtained (refer to FIG. 2 (c)). The upper surface and the side surface of the electrostatic electrode precursor 24 are covered with the first ceramic molded body 41, whereas the lower surface of the electrostatic electrode precursor 24 is exposed and is flush with the lower surface of the first ceramic molded body 41.

(1-2) Preparation of Second Ceramic Molded Body 42

A second ceramic molded body 42 is prepared separately from the first ceramic molded body 41. First, a second molding die 32 is prepared (refer to FIG. 2 (*d*)). This second molding die 32 has an inner space having a size in which a shrinkage ratio is taken into account with respect to the second ceramic calcined body 52 (inner space slightly larger than the second ceramic calcined body 52). Next, a ceramic slurry containing a ceramic powder, a solvent, a dispersant, and a gelling agent is poured into the second molding die 32. The ceramic slurry is gelled by causing a chemical reaction of the gelling agent, and the second molding die 32 is then removed. This second ceramic molded body 42 is removable from the inner surface of the second molding die 32 because the inner surface is subjected to the coating or the lining treatment with the fluorocarbon resin. Thus, the second ceramic molded body 42 is prepared (refer to FIG. 2 (*e*)).

(1-3) Preparation of Third Ceramic Molded Body 43

A third ceramic molded body 43 is prepared separately from the first ceramic molded body 41 and the second ceramic molded body 42. First, a third molding die 33 is prepared (refer to FIG. 2 (*f*)). This third molding die 33 has an inner space having a size in which a shrinkage ratio is taken into account with respect to the third ceramic calcined body 53 (inner space slightly larger than the third ceramic calcined body 53). Inner surfaces of the third molding die 33 are subjected to a coating or lining treatment with a fluorocarbon resin, and have good removability of an electrode and a molded body. An electrode paste is screen-printed on an inner surface of an upper die of the third molding die 33 to form a heater electrode precursor 26 having a dimension larger than a heater electrode 16 by about several percent in a horizontal direction (refer to FIG. 2 (*g*)). This heater electrode precursor 26 is removable from the inner surface of the third molding die 33 because of the coating or the lining treatment with the fluorocarbon resin. Side surfaces of the heater electrode precursor 26 are formed by vertical surfaces. Next, a ceramic slurry containing a ceramic powder, a solvent, a dispersant, and a gelling agent is poured into the third molding die 33. The ceramic slurry is gelled by causing a chemical reaction of the gelling agent, and the third molding die 33 is then removed. Thus, the third ceramic molded body 43 in which the heater electrode precursor 26 is embedded, i.e., an embedded-electrode-containing ceramic molded body 43X is obtained (refer to FIG. 2 (*h*)). The lower surface and the side surfaces of the heater electrode precursor 26 are covered with the third ceramic molded body 43, whereas the upper surface of the heater electrode precursor 26 is exposed and is flush with the upper surface of the third ceramic molded body 43.

(1-4) Preparation of Electrostatic Chuck 10

Next, the embedded-electrode-containing ceramic molded bodies 41X and 43X and the second ceramic molded body 42 are stacked to prepare a stacked molded body 40. Specifically, these ceramic molded bodies are stacked such that the first ceramic molded body 41 and the second ceramic molded body 42 sandwich the electrostatic electrode precursor 24 and the second ceramic molded body 42 and the third ceramic molded body 43 sandwich the heater electrode precursor 26, thus preparing the stacked molded body 40 (refer to FIG. 2 (*i*)). This stacked molded body 40 is dried, then degreased, and further calcined, thus preparing a stacked calcined body 50 (refer to FIG. 2 (*j*)). This stacked calcined body 50 is then subjected to hot-press firing to obtain an electrostatic chuck 10 (refer to FIG. 2 (*k*)).

(1-5) Advantages

According to the method for producing the electrostatic chuck 10 described above in detail, it is possible to suppress deformation of end faces of the electrostatic electrode 14 and heater electrode 16 each having a predetermined shape. Specifically, the reason for this is believed to be as follows: When a ceramic slurry is poured into the first molding die 31, in which the electrostatic electrode precursor 24 is removably attached to the inner surface of the die, and is then gelled, since the ceramic slurry in the initial stage of a reaction has a low viscosity and high fluidity, chipping of an edge of the electrostatic electrode or the precursor 24 thereof can be suppressed, and in addition, particles of the ceramic powder are uniformly arranged without spaces therebetween on the interface with the electrode and thus deformation of the electrode can be suppressed during the hot-press firing. This point also applies to the heater electrode precursor 26.

(1-6) Other Embodiments

In the embodiment described above, the first to third ceramic molded bodies 41 to 43 are stacked without conducting drying, degreasing, and calcination to prepare the stacked molded body 40, and the stacked molded body 40 is dried, degreased, and calcined to prepare the stacked calcined body 50. However, drying, degreasing, and calcination of the first to third ceramic molded bodies 41 to 43 may be performed at any stage as long as the stacked calcined body 50 is lastly obtained. For example, the first to third ceramic molded bodies 41 to 43 may be stacked after at least one of the first to third ceramic molded bodies 41 to 43 is only dried. Alternatively, the first to third ceramic molded bodies 41 to 43 may be stacked after at least one of the first to third ceramic molded bodies 41 to 43 is dried and degreased. Alternatively, the first to third ceramic molded bodies 41 to 43 may be stacked after one or two of the first to third ceramic molded bodies 41 to 43 are dried, degreased, and calcined. In any of the above cases, the resulting stacked body includes at least one molded body that has not yet been subjected to at least one of the steps of drying, degreasing, and calcination. Therefore, it is necessary that the stacked body be subjected to the at least one step that has not yet been performed. Alternatively, the first to third ceramic molded bodies 41 to 43 may be stacked after the first ceramic molded body 41, the second ceramic molded body 42, and the third ceramic molded body 43 are separately dried, degreased, and calcined. In this case, drying, degreasing, and calcination after the stacking need not be performed.

Figure 3:
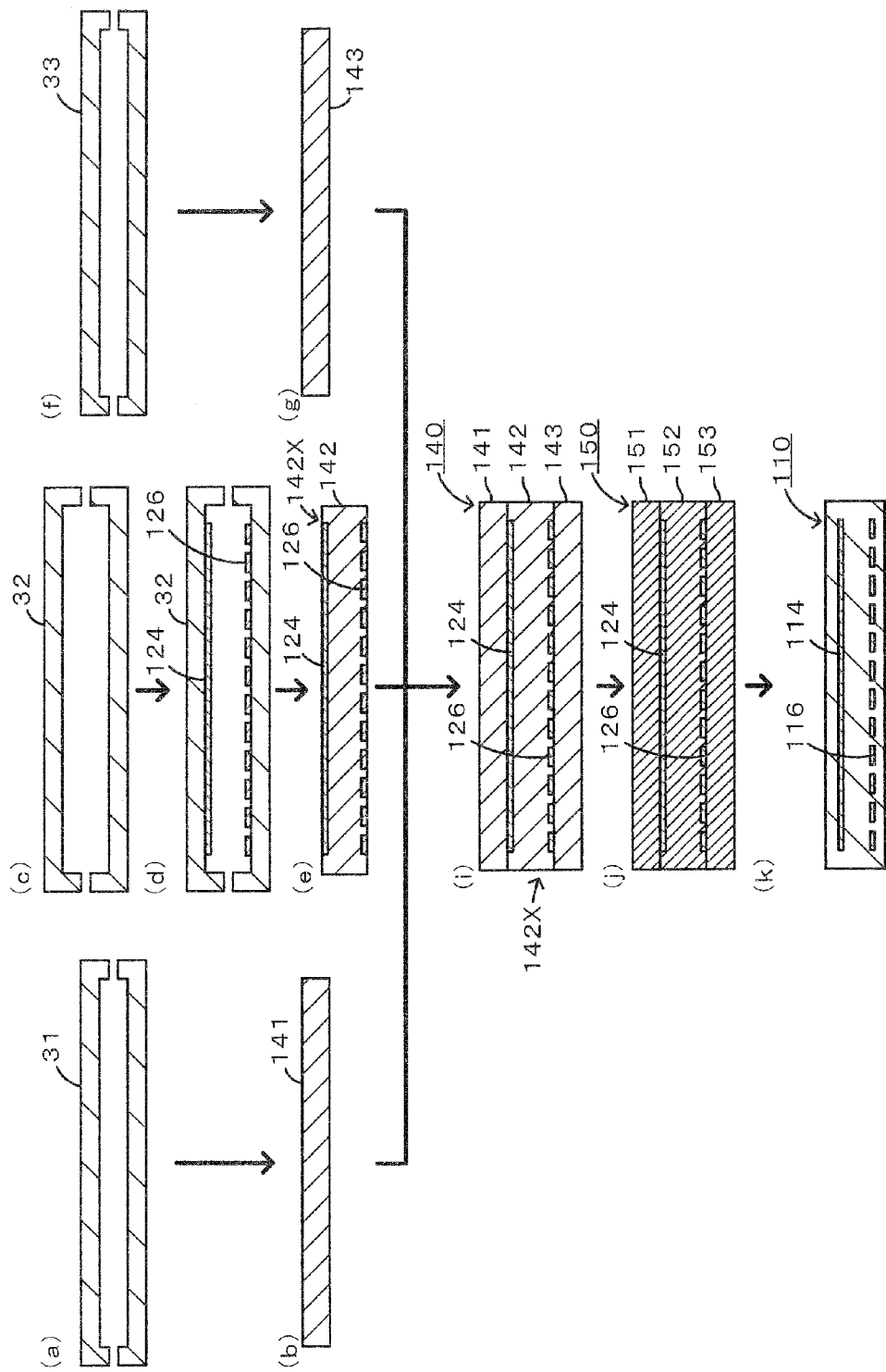
FIG. 3 is a production process drawing illustrating another example of the first method for producing an electrostatic chuck.

In the embodiment described above, the electrostatic electrode precursor 24 is embedded in the first ceramic molded body 41, and the heater electrode precursor 26 is embedded in the third ceramic molded body 43. Alternatively, as illustrated in FIG. 3, an electrostatic electrode precursor 124 may be embedded in the upper surface of a second ceramic molded body 142, a heater electrode precursor 126 may be embedded in the lower surface of the second ceramic molded body 142, and no electrode precursor may be formed in a first ceramic molded body 141 and a third ceramic molded body 143 (refer to FIGS. 3 (*a*) to (*g*)). Specifically, the first ceramic molded body 141 and the third ceramic molded body 143 are prepared by the gel casting method without attaching an electrode precursor in the first molding die 31 and the third molding die 33 (refer to FIGS. 3 (*a*), (*b*), (*f*), and (*g*)). The second ceramic molded body 142 is prepared by the gel casting method using a ceramic slurry in a state where the electrostatic electrode precursor 124 is removably attached to the inner surface of the upper die of the second molding die 32 and the heater electrode precursor 126 is removably attached to the inner surface of the lower die of the second molding die 32 (refer to FIG. 3 (*c*) to (*e*)). Thus, the second ceramic molded body 142 in which the electrostatic electrode precursor 124 and the heater electrode precursor 126 are embedded, i.e., an embedded-electrodecontaining ceramic molded body 142X is obtained. Subsequently, a stacked molded body 140 is prepared using these ceramic molded bodies 141, 142X, and 143. This stacked molded body 140 is dried, degreased, and calcined, thus preparing a stacked calcined body 150. The stacked calcined body 150 is then subjected to hot-press firing to obtain an electrostatic chuck 110 (refer to FIG. 3 (*i*) to (*k*)). These steps are the same as those illustrated in FIG. 2 (*i*) to (*k*). Also in this method, as in the embodiment described above, it is possible to suppress deformation of end faces of the electrostatic electrode 114 and the heater electrode 116.

Figure 4:
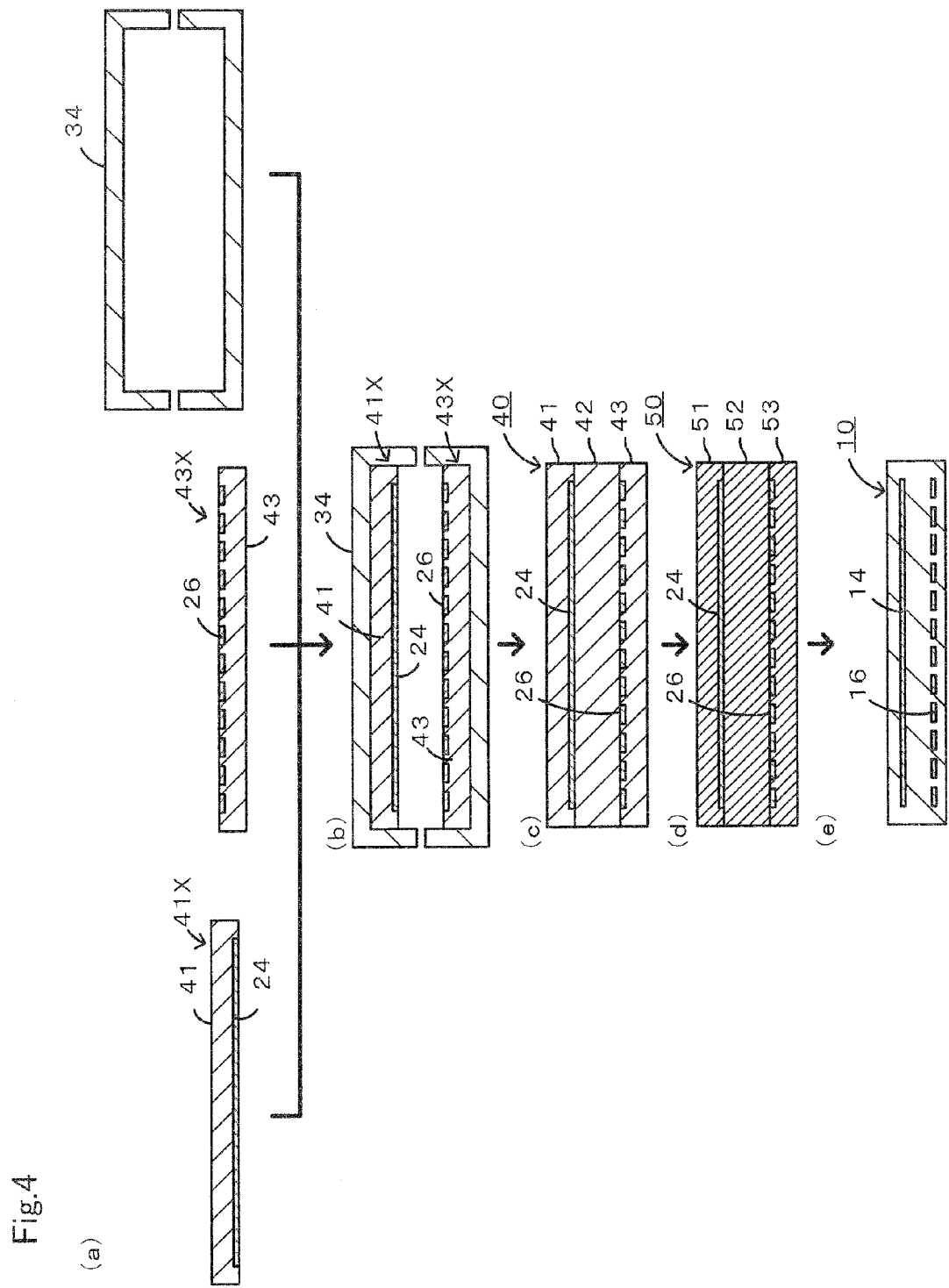
FIG. 4 is a production process drawing illustrating another example of the first method for producing an electrostatic chuck.

An electrostatic chuck 10 may be produced as illustrated in FIG. 4 using the embedded-electrode-containing ceramic molded bodies 41X and 43X prepared in the embodiment described above. Specifically, first, the ceramic molded bodies 41X and 43X and a molding die 34 for integration, the molding die 34 having an inner space having a size in which a shrinkage ratio is taken into account with respect to the electrostatic chuck 10, are prepared (refer to FIG. 4 (*a*)). Next, a surface of the embedded-electrode-containing ceramic molded body 41X, the surface being opposite to an electrode forming surface, is attached to an inner surface of an upper die of the molding die 34 for integration. In addition, a surface of the embedded-electrode-containing ceramic molded body 43X, the surface being opposite to an electrode forming surface, is attached to an inner surface of a lower die of the molding die 34 for integration (refer to FIG. 4 (*b*)). Next, a ceramic slurry containing a ceramic powder, a solvent, a dispersant, and a gelling agent is poured into the molding die 34 for integration, and the ceramic slurry is gelled by causing a chemical reaction of the gelling agent. Consequently, a second ceramic molded body 42 is formed. Thus, a stacked molded body 40 is prepared. Subsequently, this stacked molded body 40 is removed from the molding die 34 for integration (refer to FIG. 4 (*c*)). The stacked molded body 40 is dried, then degreased, and further calcined, thus preparing a stacked calcined body 50 (refer to FIG. 4 (di). This stacked calcined body 50 is subjected to hot-press firing to obtain the electrostatic chuck 10 (refer to FIG. 4 (*e*)). Also in this method, as in the embodiment described above, it is possible to suppress deformation of end faces of the electrostatic electrode 14 and the heater electrode 16.

Figure 5:
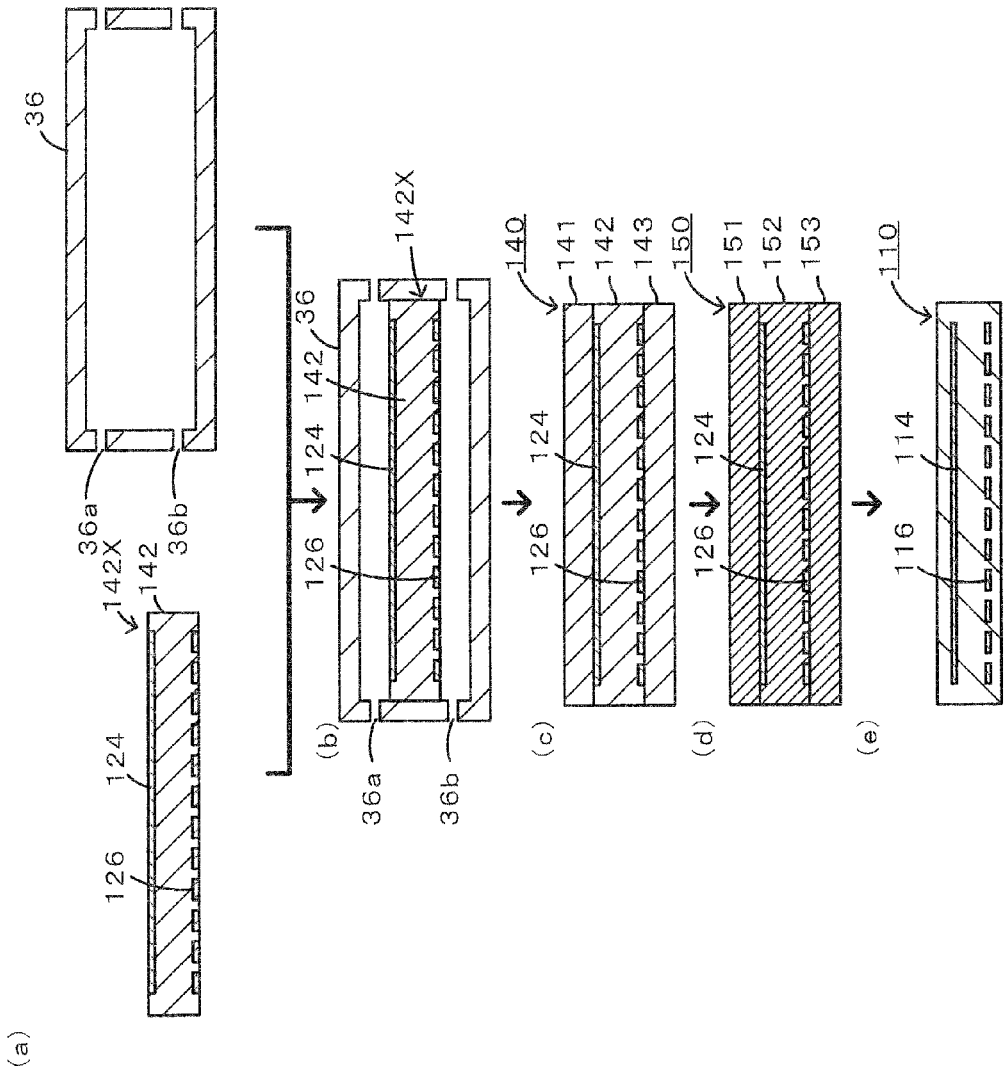
FIG. 5 is a production process drawing illustrating another example of the first method for producing an electrostatic chuck.

An electrostatic chuck 110 may be produced as illustrated in FIG. 5 using the embedded-electrode-containing ceramic molded body 142X illustrated in FIG. 3. Specifically, first, the embedded-electrode-containing ceramic molded body 142X and a molding die 36 for integration, the molding die 36 having an inner space having a size in which a shrinkage ratio is taken into account with respect to the electrostatic chuck 110, are prepared (refer to FIG. 5 (*a*)). Next, the embedded-electrode-containing ceramic molded body 142X is attached to the center of the inner space of the molding die 36 for integration (refer FIG. 5 (*b*)). The molding die 36 for integration includes two inlets 36*a* and 36*b*. The inlet 36*a* is arranged so that a ceramic slurry can be poured into a space surrounded by an upper die of the molding die 36 for integration and the embedded-electrode-containing ceramic molded body 142X. The inlet 36*b* is arranged so that a ceramic slurry can be poured into a space surrounded by a lower die of the molding die 36 for integration and the embedded-electrode-containing ceramic molded body 142X. Next, a ceramic slurry containing a ceramic powder, a solvent, a dispersant, and a gelling agent is poured from the inlets 36*a* and 36*b* into the molding die 36 for integration, and the ceramic slurry is gelled by causing a chemical reaction of the gelling agent. Consequently, a first ceramic molded body 141 and a third ceramic molded body 143 are formed. Thus, a stacked molded body 140 is prepared. Subsequently, this stacked molded body 140 is removed from the molding die 36 for integration (refer to FIG. 5 (*c*)). The stacked molded body 140 is dried, then degreased, and further calcined, thus preparing a stacked calcined body 150 (refer to FIG. 5 (*d*)). This stacked calcined body 150 is subjected to hot-press firing to obtain the electrostatic chuck 110 (refer to FIG. 5 (*e*)). Also in this method, as in the embodiment described above, it is possible to suppress deformation of end faces of the electrostatic electrode 114 and the heater electrode 116.

(2) Embodiments of Second Method for Producing Electrostatic Chuck

Figure 6:
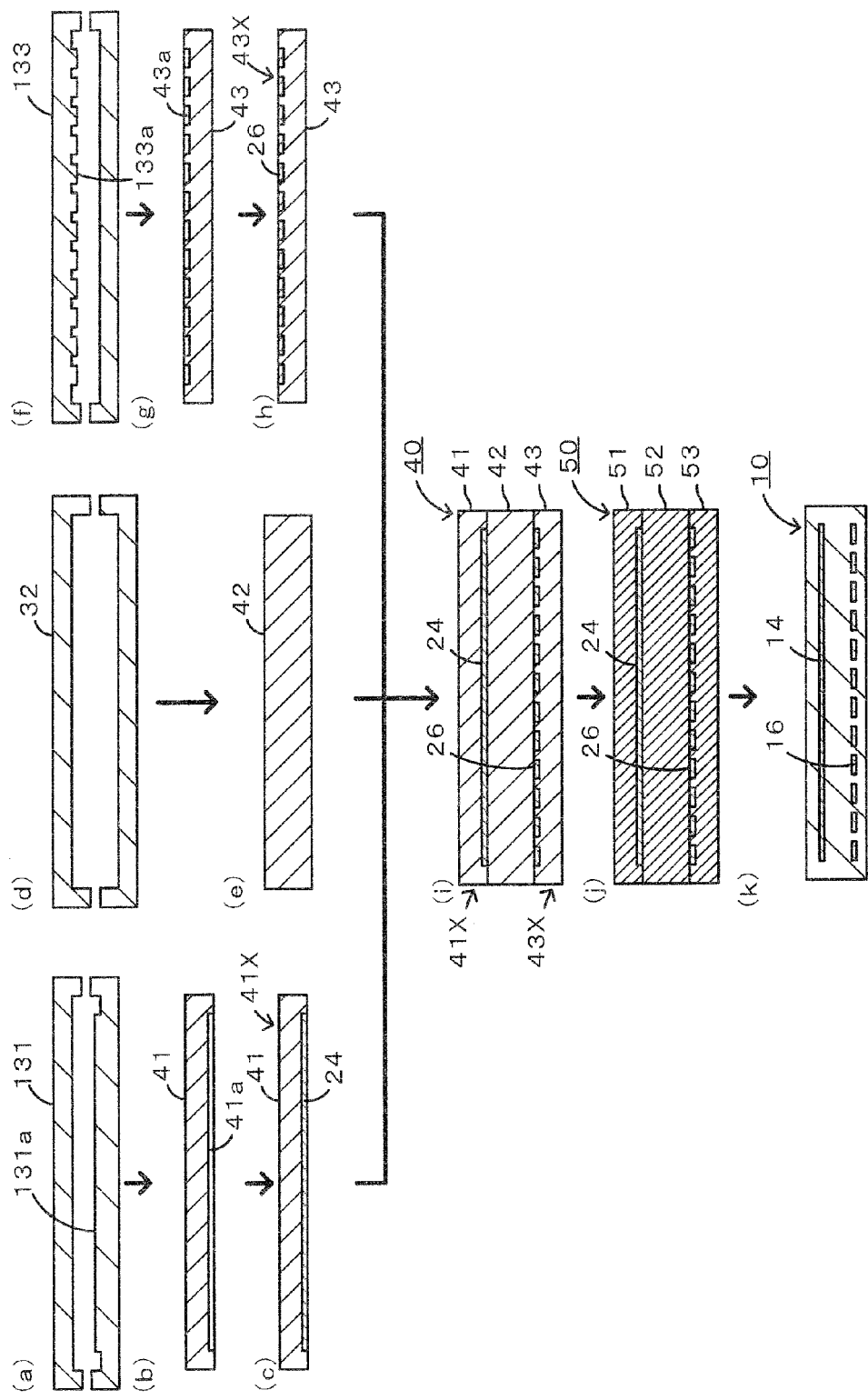
FIG. 6 is a production process drawing illustrating an example of a second method for producing an electrostatic chuck.

A method for producing an electrostatic chuck 10 will now be described with reference to FIG. 6. FIG. 6 is a production process drawing illustrating an example of a second method for producing an electrostatic chuck. This method is the same as the first method for producing an electrostatic chuck except for methods for preparing the first ceramic molded body 41 and the third ceramic molded body 43. Thus, different steps will now be mainly described.

(2-1) Preparation of First Ceramic Molded Body 41

First, a first molding die 131 is prepared (refer to FIG. 6 (*a*)). This first molding die 131 has an inner space having a size in which a shrinkage ratio is taken into account with respect to a first ceramic calcined body 51. A projection 131*a* having the same shape as an electrostatic electrode precursor 24 is non-removably provided on an inner surface of a lower die of the first molding die 131. A ceramic slurry containing a ceramic powder, a solvent, a dispersant, and a gelling agent is poured into the inner space of the first molding die 131. The ceramic slurry is gelled by causing a chemical reaction of the gelling agent, and the first molding die 131 is then removed. Thus, a first ceramic molded body 41 having a recess 41*a* corresponding to the electrostatic electrode precursor 24 is obtained (refer to FIG. 6 (*b*)). Next, an electrode paste is screen-printed in the recess 41*a* to form the electrostatic electrode precursor 24. Thus, the first ceramic molded body 41 in which the electrostatic electrode precursor 24 is embedded, i.e., an embedded-electrode-containing ceramic molded body 41X is obtained (refer to FIG. 6 (*c*)).

(2-2) Preparation of Second Ceramic Molded Body 42

Steps illustrated in FIGS. 6 (*d*) and (*e*) are the same as those of the first method for producing an electrostatic chuck described with reference to FIGS. 2 (*d*) and (*e*), and thus a description thereof is omitted.

(2-3) Preparation of Third Ceramic Molded Body

First, a third molding die 133 is prepared (refer to FIG. 6 (*f*)). This third molding die 133 has an inner space having a size in which a shrinkage ratio is taken into account with respect to a third ceramic calcined body 53 (inner space slightly larger than the third ceramic calcined body 53). A projection 133*a* having the same shape as a heater electrode precursor 26 is non-removably provided on an inner surface of an upper die of the third molding die 133. A ceramic slurry containing a ceramic powder, a solvent, a dispersant, and a gelling agent is poured into the inner space of the third molding die 133. The ceramic slurry is gelled by causing a chemical reaction of the gelling agent, and the third molding die 133 is then removed. Thus, a third ceramic molded body 43 having a recess 43*a* corresponding to the heater electrode precursor 26 is obtained (refer to FIG. 6 (*g*)). Next, an electrode paste is screen-printed in the recess 43*a* to form the heater electrode precursor 26. Thus, the third ceramic molded body 43 in which the heater electrode precursor 26 is embedded, i.e., an embedded-electrode-containing ceramic molded body 43X is obtained (refer to FIG. 6 (*h*)).

(2-4) Preparation of Electrostatic Chuck 10

Steps illustrated in FIG. 6 (*i*) to (*k*) are the same as those of the first method for producing an electrostatic chuck described with reference to FIG. 2 (*i*) to (*k*), and thus a description thereof is omitted.

(2-5) Advantages

According to the method for producing the electrostatic chuck 10 described above in detail, it is possible to suppress deformation of end faces of the electrostatic electrode 14 and heater electrode 16 each having a predetermined shape. Specifically, the first ceramic molded body 41 having the recess 41*a* is prepared, and the electrostatic electrode precursor 24 is formed in the recess 41*a* of the first ceramic molded body 41. In this case, the first ceramic molded body 41 is prepared by gelatinizing a ceramic slurry containing a ceramic powder dispersed therein. Accordingly, it is believed that chipping of an edge of the electrostatic electrode or the precursor thereof can be suppressed, and in addition, particles of the ceramic powder are uniformly arranged without spaces therebetween on the interface with the electrode and thus deformation of the electrode can be suppressed during the hot-press firing. Furthermore, since the electrostatic electrode precursor 24 does not protrude toward the outside, there is no concern about deformation of an edge of the electrostatic electrode precursor 24 caused by being rubbed against other components.

It is believed that, as a result, deformation of the end face of the electrostatic electrode 14 having a predetermined shape can be suppressed. This point also applies to the heater electrode precursor 26.

(2-6) Other Embodiments

In the embodiment described above, the first to third ceramic molded bodies 41 to 43 are stacked without conducting drying, degreasing, and calcination to prepare the stacked molded body 40, and the stacked molded body 40 is dried, degreased, and calcined to prepare the stacked calcined body 50. However, drying, degreasing, and calcination of the first to third ceramic molded bodies 41 to 43 may be performed at any stage as long as the stacked calcined body 50 is lastly obtained. For example, the first to third ceramic molded bodies 41 to 43 may be stacked after at least one of the first to third ceramic molded bodies 41 to 43 is only dried. Alternatively, the first to third ceramic molded bodies 41 to 43 may be stacked after at least one of the first to third ceramic molded bodies 41 to 43 is dried and degreased. Alternatively, the first to third ceramic molded bodies 41 to 43 may be stacked after one or two of the first to third ceramic molded bodies 41 to 43 are dried, degreased, and calcined. In any of the above cases, the resulting stacked body includes at least one molded body that has not yet been subjected to at least one of the steps of drying, degreasing, and calcination. Therefore, it is necessary that the stacked body be subjected to the at least one step that has not yet been performed. Alternatively, the first to third ceramic molded bodies 41 to 43 may be stacked after the first ceramic molded body 41, the second ceramic molded body 42, and the third ceramic molded body 43 are separately dried, degreased, and calcined. In this case, drying, degreasing, and calcination after the stacking need not be performed.

Figure 7:
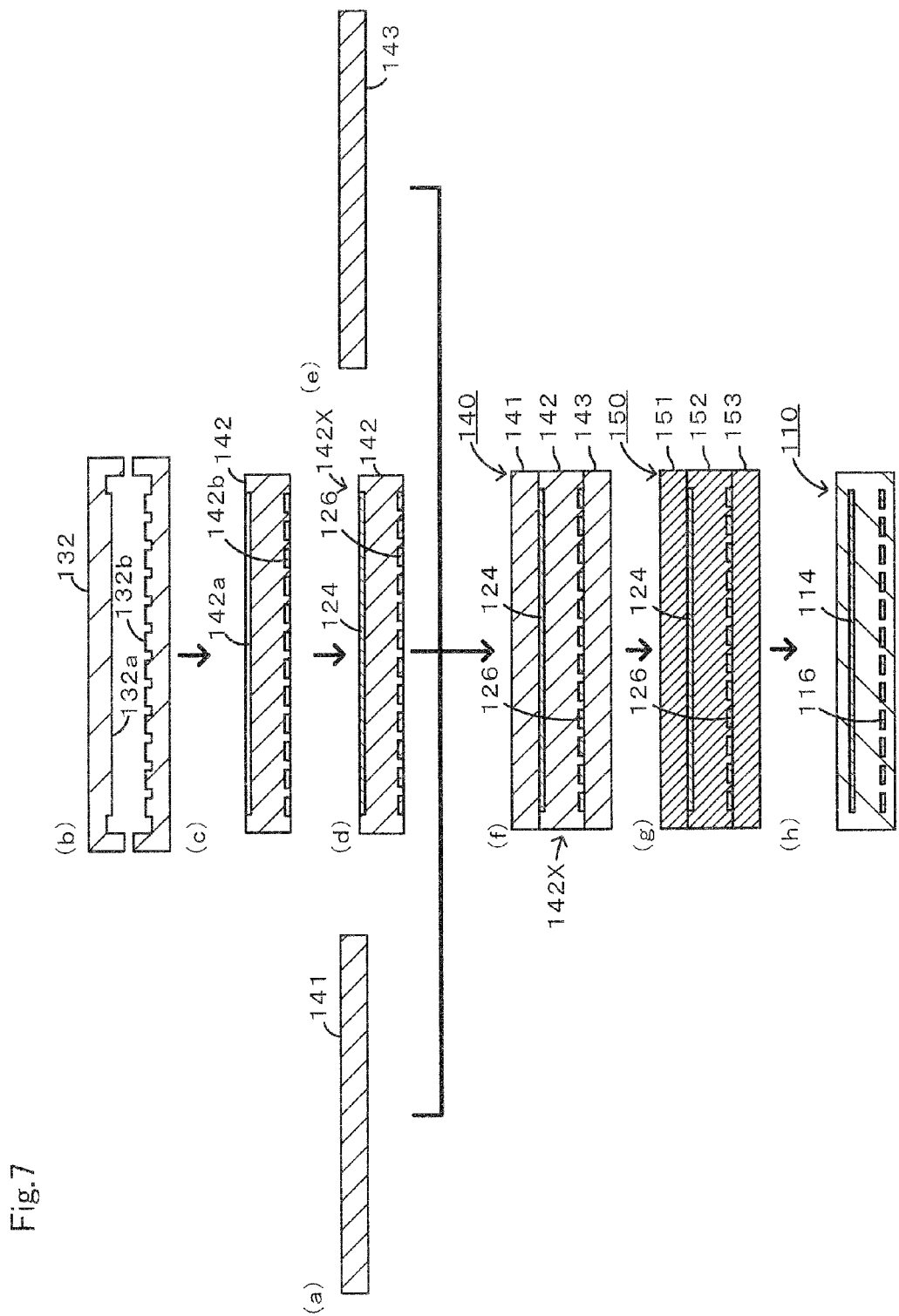
FIG. 7 is a production process drawing illustrating another example of the second method for producing an electrostatic chuck.

In the embodiment described above, the electrostatic electrode precursor 24 is formed in the recess 41*a* of the first ceramic molded body 41, and the heater electrode precursor 26 is formed in the recess 43*a* of the third ceramic molded body 43. Alternatively, as illustrated in FIG. 7, an electrostatic electrode precursor 124 may be formed in a recess 142*a* on the upper surface of a second ceramic molded body 142, a heater electrode precursor 126 may be formed in a recess 142*b* on the lower surface of the second ceramic molded body 142, and no electrode precursor may be formed in a first ceramic molded body 141 and a third ceramic molded body 143. Specifically, the first ceramic molded body 141 is prepared by the steps illustrated in FIGS. 3(*a*) and (*b*) (refer to FIG. 7 (*a*)), and the third ceramic molded body 143 is prepared by the steps illustrated in FIGS. 3(*f*) and (*g*) (refer to FIG. 7 (*e*)). In addition, regarding a second molding die 132, a projection 132*a* having the same shape as the electrostatic electrode precursor 124 is non-removably formed on an inner surface of an upper die, and a projection 132*b* having the same shape as the heater electrode precursor 126 is non-removably formed on an inner surface of a lower die (refer to FIG. 7 (*b*)). The second ceramic molded body 142 having the recesses 142*a* and 142*b* corresponding to the projections 132*a* and 132*b*, respectively, is prepared by the gel casting method using this second molding die 132 (refer to FIG. 7 (*c*)). Next, an electrode paste is screen-printed in the recesses 142*a* and 142*b*, thus obtaining the second ceramic molded body 142 in which the electrostatic electrode precursor 124 and the heater electrode precursor 126 are embedded, i.e., an embedded-electrode-containing ceramic molded body 142X (refer to FIG. 7 (*d*)). Subsequently, a stacked molded body 140 is prepared using these ceramic molded bodies 141, 142X, and 143. This stacked molded body 140 is calcined to prepare a stacked calcined body 150. The stacked calcined body 150 is then subjected to hot-press firing to obtain an electrostatic chuck 110 (refer to FIGS. 7 (*f*) to (*h*)). These steps are the same as those illustrated in FIGS. 2 (*i*) to (*k*). Also in this method, as in the embodiment described above, it is possible to suppress deformation of end faces of the electrostatic electrode 114 and the heater electrode 116.

(3) Embodiments of Third Method for Producing Electrostatic Chuck

Figure 8:
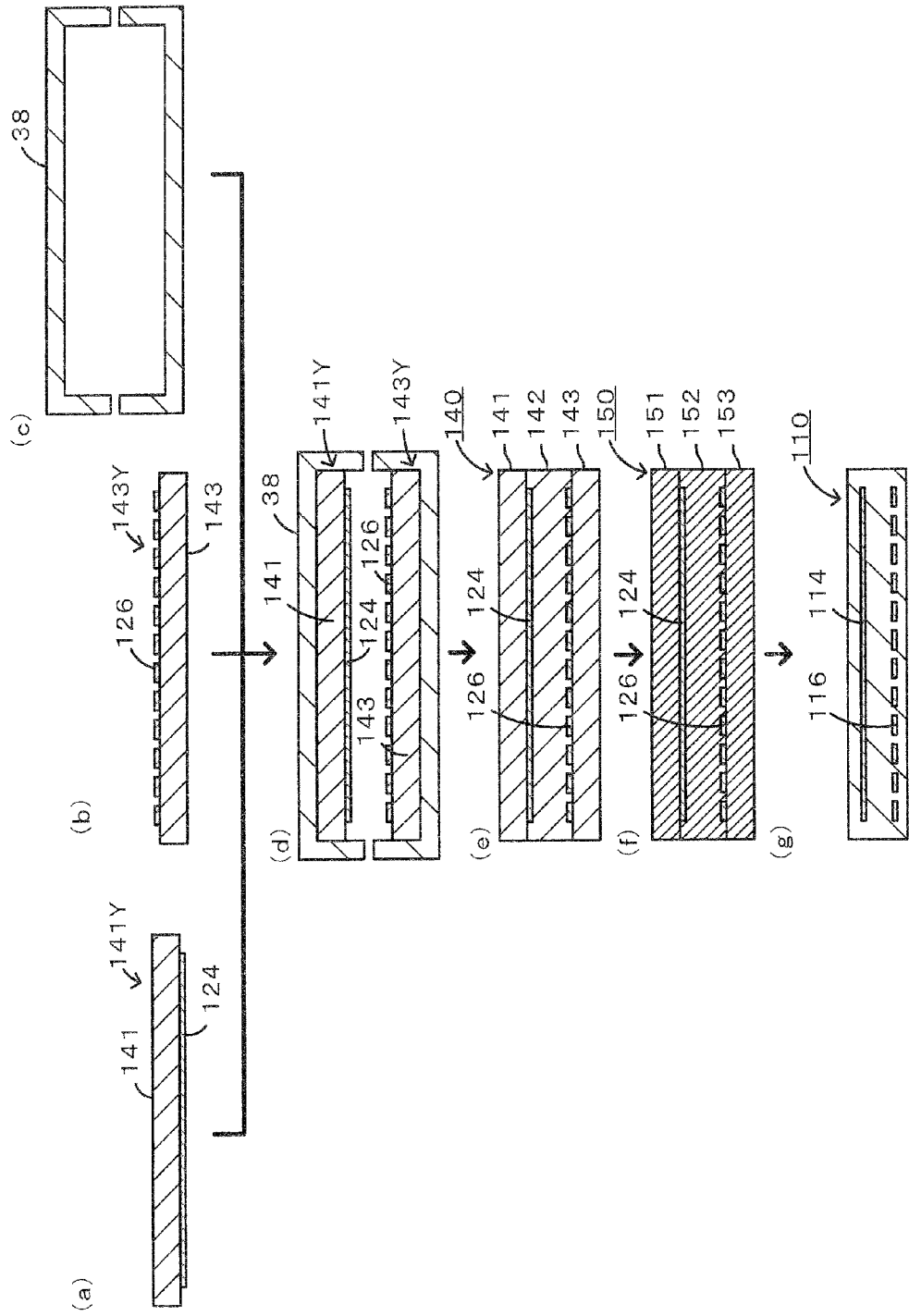
FIG. 8 is a production process drawing illustrating an example of a third method for producing an electrostatic chuck.

A method for producing an electrostatic chuck 110 will now be described with reference to FIG. 8. FIG. 8 is a production process drawing illustrating an example of a third method for producing an electrostatic chuck.

(3-1) Preparation of First Ceramic Molded Body 141 and third ceramic molded body 143

First, as illustrated in FIGS. 8 (*a*) and (*h*), a projecting-electrode-containing ceramic molded body 141Y in which a projecting electrostatic electrode precursor 124 is formed on a first ceramic molded body 141 and a projecting-electrode-containing ceramic molded body 143Y in which a projecting heater electrode precursor 126 is formed on a third ceramic molded body 143 are prepared. The former is prepared by preparing the first ceramic molded body 141 through the steps illustrated in FIGS. 3 (*a*) and (*b*), and then screen-printing an electrode paste on the lower surface of the first ceramic molded body 141 to form the electrostatic electrode precursor 124. The latter is prepared by preparing the third ceramic molded body 143 through the steps illustrated in FIGS. 3 (*f*) and (*g*), and then screen-printing an electrode paste on the upper surface of the third ceramic molded body 143 to form the heater electrode precursor 126.

(3-2) Preparation of Stacked Molded Body 140

A molding die 38 for integration, the molding die 38 having an inner space having a size in which a shrinkage ratio is taken into account with respect to an electrostatic chuck 110, is prepared (refer to FIG. 8 (*c*)). Next, a surface of the projecting-electrode-containing ceramic molded body 141Y, the surface being opposite to an electrode forming surface, is attached to an inner surface of an upper die of the molding die 38 for integration. In addition, a surface of the projecting-electrode-containing ceramic molded body 143Y, the surface being opposite to an electrode forming surface, is attached to an inner surface of a lower die of the molding die 38 for integration (refer to FIG. 8 (*d*)). Next, a ceramic slurry containing a ceramic powder, a solvent, a dispersant, and a gelling agent is poured into the molding die 38 for integration, and the ceramic slurry is gelled by causing a chemical reaction of the gelling agent. Consequently, a second ceramic molded body 142 is formed. Thus, a stacked molded body 140 is prepared. Subsequently, this stacked molded body 140 is removed from the molding die 38 for integration (refer to FIG. 8 (*e*)).

(3-3) Preparation of Electrostatic Chuck 110

The stacked molded body 140 is dried, then degreased, and further calcined, thus preparing a stacked calcined body 150 (refer to FIG. 8 (*f*)). This stacked calcined body 150 is then subjected to hot-press firing to obtain the electrostatic chuck 110 (refer to FIG. 8 (*g*)).

(3-4) Advantages

According to the method for producing the electrostatic chuck 110 described above, it is possible to suppress deformation of end faces of the electrostatic electrode 114 and heater electrode 116 each having a predetermined shape. Specifically, the reason for this is believed to be as follows: When the projecting-electrode-containing ceramic molded bodies 141Y and 143Y are removably attached to inner surfaces of the molding die 38 for integration, and a ceramic slurry is then poured into the molding die 38 for integration and gelled, since the ceramic slurry in the initial stage of a reaction has a low viscosity and high fluidity, chipping of end faces of the electrostatic electrode 114 and the heater electrode 116 can be suppressed, and in addition, particles of the ceramic powder are uniformly arranged without spaces therebetween on each interface with the electrode and thus deformation of the electrodes can be suppressed during the hot-press firing.

(3-5) Other Embodiments

In the embodiment described above, the first ceramic molded body 141 and the third ceramic molded body 143 are set in the molding die 38 for integration without conducting drying, degreasing, and calcination. However, drying, degreasing, and calcination of the first ceramic molded body 141 and the third ceramic molded body 143 may be performed at any stage. For example, the first ceramic molded body 141 and the third ceramic molded body 143 may be set in the molding die 38 for integration after at least one of the first ceramic molded body 141 and the third ceramic molded body 143 is only dried. Alternatively, the first ceramic molded body 141 and the third ceramic molded body 143 may be set in the molding die 38 for integration after at least one of the first ceramic molded body 141 and the third ceramic molded body 143 is dried and degreased. Alternatively, the first ceramic molded body 141 and the third ceramic molded body 143 may be set in the molding die 38 for integration after at least one of the first ceramic molded body 141 and the third ceramic molded body 143 is dried, degreased, and calcined. In any of the above cases, the resulting stacked body after being taken out from the molding die 38 for integration includes the second ceramic molded body 142, which has not yet been subjected to drying, degreasing, and calcination. Therefore, it is necessary that the stacked body be dried, degreased, and calcined. In the case where any of drying, degreasing, and calcinations is performed in advance, the timing thereof may be either before the printing of the electrode paste or after the printing of the electrode paste.

Figure 9:
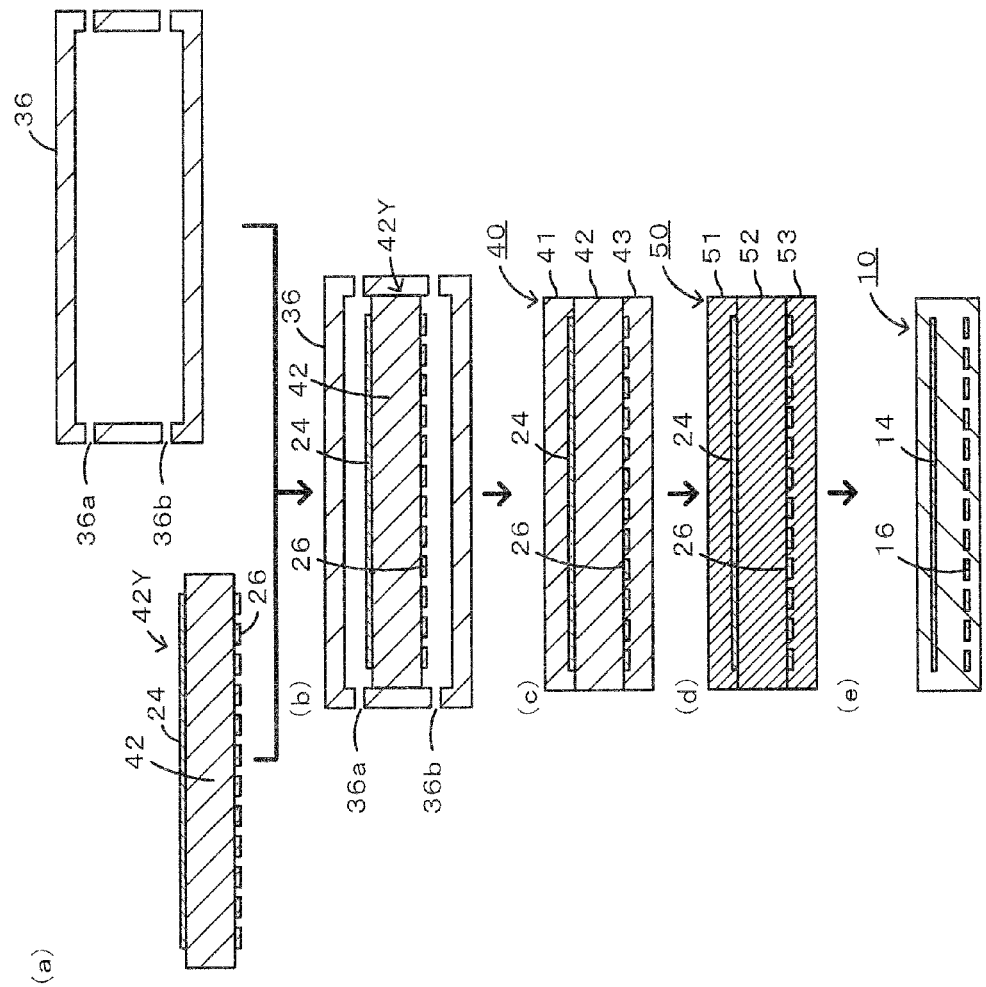
FIG. 9 is a production process drawing illustrating another example of the third method for producing an electrostatic chuck.

In the embodiment described above, the method includes the steps of removably attaching the projecting-electrode-containing ceramic molded body 141Y to the inner surface of the upper die of the molding die 38 for integration, and removably attaching the projecting-electrode-containing ceramic molded body 143Y to the inner surface of the lower die of the molding die 38 for integration. Alternatively, as illustrated in FIG. 9, the method may include a step of removably attaching a projecting-electrode-containing ceramic molded body 42Y to the center of the inner space of the molding die 36 for integration (described above). Specifically, a second ceramic molded body 42 is prepared as in FIGS. 2(*d*) and (*e*). An electrostatic electrode precursor 24 and a heater electrode precursor 26 are respectively formed on the upper surface and the lower surface of the second ceramic molded body 42 by screen-printing an electrode paste to form a projecting-electrode-containing ceramic molded body 42Y (refer to FIG. 9 (*a*)). The projecting-electrode-containing ceramic molded body 42Y is attached to the center of the inner space of a molding die 36 for integration (refer to FIG. 9 (*b*)). An inlet 36*a* is arranged so that a ceramic slurry can be poured into a space surrounded by an upper die of the molding die 36 for integration and the projecting-electrode-containing ceramic molded body 42Y. An inlet 36*b* is arranged so that a ceramic slurry can be poured into a space surrounded by a lower die of the molding die 36 for integration and the projecting-electrode-containing ceramic molded body 42Y. Next, a ceramic slurry is poured from the inlets 36*a* and 36*b* and then gelled to form a first ceramic molded body 41 and a third ceramic molded body 43, respectively. Thus, a stacked molded body 40 is prepared. Subsequently, this stacked molded body 40 is removed from the molding die 36 for integration (refer to FIG. 9 (*c*)). The stacked molded body 40 is dried, degreased, and calcined, thus preparing a stacked calcined body 50 (refer to FIG. 9 (*d*)). This stacked calcined body 50 is subjected to hot-press firing to obtain an electrostatic chuck 10 (refer to FIG. 9 (*e*)). Also in this method, as in the embodiment described above, it is possible to suppress deformation of end faces of the electrostatic electrode 14 and the heater electrode 16.

In (1) to (3) of item 6. above, methods for producing electrostatic chucks having a heater electrode therein have been described. Alternatively, an electrostatic chuck that does not have a heater electrode therein can also be produced by any of the methods by omitting the heater electrode and the third ceramic molded body.

EXAMPLES

Example 1

An electrostatic chuck was produced in accordance with the method illustrated in FIG. 2. First, a first molding die having a disc-shaped inner space with a diameter of 355 mm and a height of 3.0 mm, a second molding die having a disc-shaped inner space with a diameter of 355 mm and a height of 6.0 mm, and a third molding die having a disc-shaped inner space with a diameter of 355 mm and a height of 3.0 mm were prepared.

100 parts by weight of a tungsten carbide (WC) powder (average particle diameter: 1.5 μm) and an alumina powder (average particle diameter: 0.5 μm) were weighed so that the alumina content was 20% by weight. Five parts by weight of polyvinyl butyral functioning as a binder and 20 parts by weight of terpineol functioning as a solvent were added to the powders, and mixed to prepare an electrode paste. The electrode paste was screen-printed on an inner surface of a lower die of the first molding die so as to have a diameter of 290 mm and a height of 10 µm to form an electrostatic electrode precursor. Furthermore, the electrode paste was screen-printed on an inner surface of an upper die of the third molding die so as to have a shape of a single brush stroke with a width of 8 mm and a height of 50 µm to form a heater electrode precursor.

One hundred parts by weight of an alumina powder (average particle diameter: 0.5 µm, purity: 99.7%), 0.04 parts by weight of magnesia, 3 parts by weight of a polycarboxylic acid copolymer functioning as a dispersant, and 20 parts by weight of a polybasic acid ester functioning as a solvent were weighed. These components were mixed using a ball mill (trommel) for 14 hours to prepare a slurry precursor. A gelling agent containing, namely, 3.3 parts by weight of 4,4'-diphenylmethane diisocyanate as an isocyanate, 0.3 parts by weight of ethylene glycol as a polyol, and 0.1 parts by weight of 6-dimethylamino-1-hexanol as a catalyst, was added to the slurry precursor, and the resulting mixture was stirred using a rotary and revolutionary stirrer for 12 minutes to prepare a ceramic slurry. The ceramic slurry was poured into each of the first molding die in which the electrostatic electrode precursor was printed, the second molding die that was not subjected to printing, and the third molding die in which the heater electrode precursor was printed. Subsequently, the molding dies were left to stand at 22° C. for two hours to gel the ceramic slurry by causing a chemical reaction of the gelling agent in each of the molding dies. The molding dies were then removed. Thus, an electrostatic-electrode-containing ceramic molded body in which the electrostatic electrode precursor was embedded in a first ceramic molded body, a second ceramic molded body having no electrode, and a heater-electrode-containing ceramic molded body in which the heater electrode precursor was embedded in a third ceramic molded body were obtained.

Next, these ceramic molded bodies were stacked such that the electrostatic electrode precursor was sandwiched between the first and second ceramic molded bodies and the heater electrode precursor was sandwiched between the second and third ceramic molded bodies to obtain a stacked molded body. This stacked molded body was dried at 100° C. for ten hours, then degreased at a maximum temperature of 500° C. for ten hours, and further calcined in an argon atmosphere at a maximum temperature of 820° C. for one hour to obtain a stacked calcined body.

This stacked calcined body was subjected to hot-press firing to obtain an electrostatic chuck having an electrostatic electrode and a heater electrode therein. The hot-press firing was conducted in a nitrogen atmosphere at a pressure of 100 kgf/cm² and at a maximum temperature of 1,600° C. for two hours. The resulting electrostatic chuck had a carbon content of 0.1% by weight or less and a relative density of 98% or more. When a longitudinal cross section of the electrostatic electrode was viewed, the end face of the electrostatic electrode was formed by a flat, vertical surface (the angle θ in FIG. 1 was 180°) and deformation was not observed.

Example 2

An electrostatic chuck was produced in accordance with the method illustrated in FIG. 3. First, first to third molding dies the same as those used in Example 1 were prepared. Next, an electrode paste was screen-printed on an inner surface of an upper die of the second molding die to form an electrostatic electrode precursor as in Example 1. Furthermore, an electrode paste was screen-printed on a lower die of the second molding die to form a heater electrode precursor as in Example 1.

Subsequently, a ceramic slurry the same as that used in Example 1 was poured into each of the first molding die that was not subjected to printing, the second molding die in which the electrostatic electrode precursor and the heater electrode precursor were printed, and the third molding die that was not subjected to printing. The ceramic slurry was gelled and each of the molding dies was then removed. Thus, a first ceramic molded body having no electrode, an electrode-containing ceramic molded body in which the electrostatic electrode precursor and the heater electrode precursor were embedded in a second ceramic molded body, and a third ceramic molded body having no electrode were obtained.

Next, these ceramic molded bodies were stacked such that the electrostatic electrode precursor was sandwiched between the first and second ceramic molded bodies and the heater electrode precursor was sandwiched between the second and third ceramic molded bodies to prepare a stacked molded body. This stacked molded body was dried, degreased, and calcined as in Example 1. The resulting stacked calcined body was subjected to hot-press firing under the same conditions as in Example 1 to obtain an electrostatic chuck having an electrostatic electrode and a heater electrode therein. The resulting electrostatic chuck had a carbon content of 0.1% by weight or less and a relative density of 98% or more. When a longitudinal cross section of the electrostatic electrode was viewed, the end face of the electrostatic electrode was formed by a bulging surface having an angle θ in FIG. 1 of 172° and deformation was hardly observed.

Example 3

An electrostatic chuck was produced in accordance with the third method for producing an electrostatic chuck illustrated in FIG. 8. First, a first molding die and a third molding die that were the same as those used in Example 1 were prepared. In addition, a molding die for integration, the molding die having an inner space having a size corresponding to a stacked molded body, was prepared. Next, a ceramic slurry the same as that used in Example 1 was poured into each of the first and third molding dies. The ceramic slurry was gelled and each of the molding dies was then removed. Thus, a first ceramic molded body and a third ceramic molded body were obtained. Subsequently, an electrode paste was screen-printed on the lower surface of the first ceramic molded body to prepare the first ceramic molded body having a projecting electrostatic electrode precursor thereon. Furthermore, an electrode paste was screen-printed on the upper surface of the third ceramic molded body to prepare the third ceramic molded body having a projecting heater electrode precursor thereon.

Next, a surface of the first ceramic molded body having the projecting electrostatic electrode precursor, the surface being opposite to an electrode forming surface, was attached an inner surface of an upper die of the molding die for integration. In addition, a surface of the third ceramic molded body having the projecting heater electrode precursor, the surface being opposite to an electrode forming surface, was attached to an inner surface of a lower die of the molding die for integration. Next, a ceramic slurry the same as that used in Example 1 was poured into the molding die for integration. The ceramic slurry was gelled by causing a chemical reaction of the gelling agent. Thus, a second ceramic molded body was formed. As a result, a stacked composite body having a structure in which the electrostatic electrode precursor was sandwiched between the first and second ceramic molded bodies and the heater electrode precursor was sandwiched between the second and third ceramic molded bodies was obtained. Subsequently, this stacked composite body was removed from the molding die for integration.

The stacked composite body was dried, degreased, and calcined as in Example 1 to prepare a stacked calcined body. This stacked calcined body was subjected to hot-press firing under the same conditions as in Example 1 to obtain an electrostatic chuck having an electrostatic electrode and a heater electrode therein. The resulting electrostatic chuck had a carbon content of 0.1% by weight or less and a relative density of 98% or more. When a longitudinal cross section of the electrostatic electrode was viewed, the end face of the electrostatic electrode was formed by a bulging surface having an angle θ in FIG. 1 of 176° and deformation was hardly observed.

Example 4

An electrostatic chuck was prepared as in Example 3 except that, in Example 3, the first and third ceramic molded bodies before the printing of the electrode paste were dried at 100° C. for ten hours, then degreased at a maximum temperature of 500° C. for ten hours, and further calcined in an argon atmosphere at a maximum temperature of 820° C. for one hour to prepare first and third ceramic calcined bodies, respectively, and the electrode paste was then printed on each of the first and third ceramic calcined bodies. The resulting electrostatic chuck had a carbon content of 0.1% by weight or less and a relative density of 98% or more. When a longitudinal cross section of the electrostatic electrode was viewed, the end face of the electrostatic electrode was formed by a bulging surface having an angle θ in FIG. 1 of 176° and deformation was hardly observed.

Example 5

An electrostatic chuck was produced in accordance with the third method for producing an electrostatic chuck illustrated in FIG. 9. First, a second molding die the same as that used in Example 1 was prepared. In addition, a molding die for integration, the molding die having a space having a size corresponding to a stacked molded body, was prepared. Next, a ceramic slurry the same as that used in Example 1 was poured into the second molding die. The ceramic slurry was gelled and the second molding die was then removed. Thus, a second ceramic molded body was prepared. Subsequently, an electrode paste the same as that used in Example 1 was screen-printed on the upper surface and the lower surface of the second ceramic molded body to obtain the second ceramic molded body having a projecting electrostatic electrode precursor and a projecting heater electrode precursor thereon.

Next, the second ceramic molded body was arranged at the center of the inner space of the molding die for integration. A ceramic slurry the same as that used in Example 1 was then poured into empty spaces of the inner space of the molding die for integration. The ceramic slurry was gelled by causing a chemical reaction of the gelling agent. Thus, a first ceramic molded body and a third ceramic molded body were formed. As a result, a stacked composite body having a structure in which the electrostatic electrode precursor was sandwiched between the first and second ceramic molded bodies and the heater electrode precursor was sandwiched between the second and third ceramic molded bodies was obtained. Subsequently, this stacked composite body was removed from the molding die for integration.

The stacked composite body was dried, degreased, and calcined as in Example 1 to prepare a stacked calcined body. This stacked calcined body was subjected to hot-press firing under the same conditions as in Example 1 to obtain an electrostatic chuck having an electrostatic electrode and a heater electrode therein. The resulting electrostatic chuck had a carbon content of 0.1% by weight or less and a relative density of 98% or more. When a longitudinal cross section of the electrostatic electrode was viewed, the end face of the electrostatic electrode was formed by a bulging surface having an angle θ in FIG. 1 of 174° and deformation was hardly observed.

Example 6

An electrostatic chuck was prepared as in Example 5 except that, in Example 5, the second ceramic molded body before the printing of the electrode paste was dried at 100° C. for ten hours, then degreased at a maximum temperature of 500° C. for ten hours, and further calcined in an argon atmosphere at a maximum temperature of 820° C. for one hour to prepare a second ceramic calcined body, and the electrode paste was then printed on both surfaces of the second ceramic calcined body. The resulting electrostatic chuck had a carbon content of 0.1% by weight or less and a relative density of 98% or more. When a longitudinal cross section of the electrostatic electrode was viewed, the end face of the electrostatic electrode was formed by a bulging surface having an angle θ in FIG. 1 of 176° and deformation was hardly observed.

Comparative Example 1

First, an upper alumina sintered body functioning as a dielectric layer and a lower alumina sintered body functioning as a lower layer were prepared. The upper alumina sintered body was prepared as follows: An alumina powder having a purity of 99.7% and a MgO raw material powder functioning as a sintering aid were weighed such that the content of MgO was 0.04% by weight. Polyvinyl alcohol (PVA) functioning as a binder, water, and a dispersant were added to these raw material powders, and the resulting mixture was mixed using a trommel for 16 hours to prepare a slurry. This slurry was spray-dried using a spray dryer, and was then maintained at 500° C. for five hours to remove the binder. Thus, an alumina granulated powder having an average particle size of about 80 μm was prepared. A die was filled with this alumina granulated powder, and press-molding was conducted at a pressure of 200 kg/cm². The resulting molded body was placed in a saggar composed of carbon and was fired by a hot-press firing method. The firing was performed under application of a pressure of 100 kg/cm², and in a nitrogen pressurized atmosphere (150 kPa) while the temperature was increased at a rate of 300° C./h and then maintained at 1,600° C. for two hours. Thus, the alumina sintered body corresponding to the dielectric layer was obtained. This alumina sintered body was subjected to a grinding process to prepare a disc-shaped upper alumina sintered body having a diameter ϕ of 300 mm and a thickness of 6 mm. In this step, one surface of the alumina sintered body was finished so as to be a smooth surface having a surface roughness ha of 0.8 µl or less. The lower alumina sintered body was also prepared in accordance with this method. Subsequently, an electrode paste the same as that used in Example 1 was screen-printed on the upper alumina sintered body to form an electrostatic electrode precursor. Furthermore, the electrode paste was screen-printed on the lower alumina sintered body to form a heater electrode precursor.

Next, the upper alumina sintered body having the electrostatic electrode precursor thereon was placed in a die such that the electrostatic electrode precursor was located on the upper side. A predetermined amount of the alumina granulated powder prepared in the preparation of the upper alumina sintered body was placed thereon. The lower alumina sintered body having the heater electrode precursor thereon was further placed thereon such that the heater electrode precursor was located on the lower side. In this state, a pressure of 200 kgf/cm² was applied in the vertical compression direction to form a stacked body. This stacked body has a structure in which the electrostatic electrode precursor is sandwiched between the upper alumina sintered body and a layer of the alumina granulated powder, and the heater electrode precursor is sandwiched between the layer of the alumina granulated powder and the lower alumina sintered body. This stacked body was dried, degreased, and calcined as in Example 1, and was then subjected to hot-press firing to obtain an electrostatic chuck having an electrostatic electrode and a heater electrode therein. The hot-press firing was performed under the same conditions as in Example 1.

The resulting electrostatic chuck had a carbon content of 0.1% by weight or less and a relative density of 98% or more. When a longitudinal cross section of the electrostatic electrode was viewed, the end face of the electrostatic electrode had an acute angle shape (the angle θ in FIG. 1 was 30°).

Comparative Example 2

First, a middle alumina sintered body functioning as an intermediate layer Was prepared in accordance with the upper alumina sintered body of Comparative Example 1. Subsequently, an electrode paste the same as that used in Example 1 was screen-printed on the upper surface and the lower surface of the middle alumina sintered body to respectively form an electrostatic electrode precursor and a heater electrode precursor.

Subsequently, a predetermined amount of the alumina granulated powder prepared in the preparation of the middle alumina sintered body was placed in a die. The middle alumina sintered body was placed thereon such that the electrostatic electrode precursor was located on the lower side and the heater electrode precursor was located on the upper side. A predetermined amount of the alumina granulated powder was further placed thereon. In this state, a pressure of 200 kgf/cm² was applied in the vertical compression direction to form a stacked body. This stacked body has a structure in which the electrostatic electrode precursor is sandwiched between one layer of the alumina granulated powder and the middle alumina sintered body, and the heater electrode precursor is sandwiched between the middle alumina sintered body and the other layer of the alumina granulated powder. This stacked body was dried, degreased, and calcined as in Example 1, and was then subjected to hot-press firing to obtain an electrostatic chuck having an electrostatic electrode and a heater electrode therein. The hot-press firing was performed under the same conditions as in Example 1.

The resulting electrostatic chuck had a carbon content of 0.1% by weight or less and a relative density of 98% or more. When a longitudinal cross section of the electrostatic electrode was viewed, the end face of the electrostatic electrode had an acute angle shape (the angle θ in FIG. 1 was 20°).

The present application claims priority on the basis of the Japanese Patent Application No. 2011-075445 filed on Mar. 30, 2011, the entire contents of which are incorporated herein by reference.

What is claimed is:

1. A method for producing an electrostatic chuck obtained by conducting hot-press firing of a stacked calcined body in which a pair of ceramic calcined bodies are stacked so as to sandwich an electrostatic electrode having a predetermined shape or a precursor thereof, the method comprising the steps of:
   (a) pouring a ceramic slurry containing a ceramic powder, a solvent, a dispersant, and a gelling agent into a first molding die in which the electrostatic electrode or the precursor thereof is removably attached to an inner surface of the first molding die, gelatinizing the ceramic slurry by causing a chemical reaction of the gelling agent, and then removing the first molding die to prepare an embedded-electrode-containing ceramic molded body in which the electrostatic electrode or the precursor thereof is embedded in a first ceramic molded body;
   (b) preparing a second ceramic molded body; and
   (c) preparing the stacked calcined body using the embedded-electrode-containing ceramic molded body and the second ceramic molded body, and conducting hot-press firing of the stacked calcined body,
   wherein, in step (b), the second ceramic molded body is prepared by preparing a molding die for integration, removably attaching a surface of the embedded-electrode-containing ceramic molded body, the surface being opposite to an electrode forming surface, to an inner surface of the molding die for integration, then pouring a ceramic slurry containing a ceramic powder, a solvent, a dispersant, and a gelling agent into the molding die for integration, and gelatinizing the ceramic slurry by causing a chemical reaction of the gelling agent, and
   in step (c), the stacked calcined body is prepared by taking out, from the molding die for integration, a stacked composite body in which the embedded-electrode-containing ceramic molded body and the second ceramic molded body are stacked, and calcining the stacked composite body; and
   wherein the first ceramic molded body and the second ceramic molded body are made from the same ceramic slurry.

2. The method for producing an electrostatic chuck according to claim 1, wherein, in step (a), the embedded-electrode-containing ceramic molded body is calcined to prepare an embedded-electrode-containing ceramic calcined body.

3. The method for producing an electrostatic chuck according to claim 1, wherein the ceramic powder has an average particle diameter of 0.4 to 0.6 µm.

4. The method for producing an electrostatic chuck according to claim 1, wherein the solvent is at least one selected from the group consisting of hydrocarbon solvents, ether solvents, alcohol solvents, ketone solvents, ester solvents, and polybasic solvents.

5. A method for producing an electrostatic chuck obtained by conducting hot-press firing of a stacked calcined body in which a pair of ceramic calcined bodies are stacked so as to sandwich an electrostatic electrode having a predetermined shape or a precursor thereof, the method comprising the steps of:
(a) pouring a ceramic slurry containing a ceramic powder, a solvent, a dispersant, and a gelling agent into a first molding die in which a projection having the same shape as the electrostatic electrode or the precursor thereof is non-removably provided on an inner surface of the first molding die, gelatinizing the ceramic slurry by causing a chemical reaction of the gelling agent, then removing the first molding die to prepare a first ceramic molded body having a recess corresponding to the projection, and forming the electrostatic electrode or the precursor thereof in the recess to prepare an embedded-electrode-containing ceramic molded body;
(b) preparing a second ceramic molded body; and
(c) preparing the stacked calcined body using the embedded-electrode-containing ceramic molded body and the second ceramic molded body, and conducting hot-press firing of the stacked calcined body,
wherein, in step (b), the second ceramic molded body is prepared by preparing a molding die for integration, removably attaching a surface of the embedded-electrode-containing ceramic molded body, the surface being opposite to an electrode forming surface, to an inner surface of the molding die for integration, then pouring a ceramic slurry containing a ceramic powder, a solvent, a dispersant, and a gelling agent into the molding die for integration, gelatinizing the ceramic slurry by causing a chemical reaction of the gelling agent, and
in step (c), the stacked calcined body is prepared by taking out, from the molding die for integration, a stacked composite body in which the embedded-electrode-containing ceramic molded body and the second ceramic molded body are stacked, and calcining the stacked composite body; and
wherein the first ceramic molded body and the second ceramic molded body are made from the same ceramic slurry.

6. The method for producing an electrostatic chuck according to claim 5,
wherein, in step (a), the first ceramic molded body is calcined before or after the formation of the electrostatic electrode or the precursor thereof in the recess to prepare an embedded-electrode-containing ceramic calcined body.

7. The method for producing an electrostatic chuck according to claim 5, wherein the ceramic powder has an average particle diameter of 0.4 to 0.6 μm.

8. The method for producing an electrostatic chuck according to claim 5, wherein the solvent is at least one selected from the group consisting of hydrocarbon solvents, ether solvents, alcohol solvents, ketone solvents, ester solvents, and polybasic solvents.

9. A method for producing an electrostatic chuck obtained by conducting hot-press firing of a stacked calcined body in which a pair of ceramic calcined bodies are stacked so as to sandwich an electrostatic electrode having a predetermined shape or a precursor thereof, the method comprising the steps of:
(a) preparing a first ceramic molded body, and forming the electrostatic electrode or the precursor thereof on a surface of the first ceramic molded body to prepare a projecting-electrode-containing ceramic molded body;
(b) removably attaching a surface of the projecting-electrode-containing ceramic molded body, the surface being opposite to an electrode forming surface, to an inner surface of a molding die for integration, then pouring a ceramic slurry containing a ceramic powder, a solvent, a dispersant, and a gelling agent into the molding die for integration, gelatinizing the ceramic slurry by causing a chemical reaction of the gelling agent to prepare a second ceramic molded body, and then removing the molding die for integration to prepare a stacked composite body including the projecting-electrode-containing ceramic molded body and the second ceramic molded body; and
(c) preparing the stacked calcined body using the stacked composite body, and conducting hot-press firing of the stacked calcined body,
wherein, in step (a), the first ceramic molded body is prepared by pouring a ceramic slurry containing a ceramic powder, a solvent, a dispersant, and a gelling agent into a first molding die, gelatinizing the ceramic slurry by causing a chemical reaction of the gelling agent, and then removing the first molding die; and
wherein the first ceramic molded body and the second ceramic molded body are made from the same ceramic slurry.

10. The method for producing an electrostatic chuck according to claim 9,
wherein, in step (a), the first ceramic molded body is calcined before or after the formation of the electrostatic electrode or the precursor thereof on the surface to prepare a projecting-electrode-containing ceramic calcined body.

11. The method for producing an electrostatic chuck according to claim 9, wherein the ceramic powder has an average particle diameter of 0.4 to 0.6 μm.

12. The method for producing an electrostatic chuck according to claim 9, wherein the solvent is at least one selected from the group consisting of hydrocarbon solvents, ether solvents, alcohol solvents, ketone solvents, ester solvents, and polybasic solvents.

* * * * *